(12) United States Patent
Fei et al.

(10) Patent No.: US 8,591,996 B2
(45) Date of Patent: *Nov. 26, 2013

(54) METHOD FOR WHISKER FORMATION ON METALLIC FIBERS AND SUBSTRATES

(75) Inventors: Weifeng Fei, Orlando, FL (US); Suresh C. Kuiry, Orlando, FL (US); Sudipta Seal, Oviedo, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/475,547

(22) Filed: May 18, 2012

(65) Prior Publication Data

US 2012/0227869 A1 Sep. 13, 2012

Related U.S. Application Data

(62) Division of application No. 13/224,848, filed on Sep. 2, 2011, now Pat. No. 8,247,034, which is a division of application No. 11/135,987, filed on May 24, 2005, now Pat. No. 8,084,096.

(60) Provisional application No. 60/573,818, filed on May 24, 2004.

(51) Int. Cl.
*B05D 3/02* (2006.01)

(52) U.S. Cl.
USPC .................................................. 427/376.2

(58) Field of Classification Search
USPC ........................................ 427/376.2; 148/285
See application file for complete search history.

(56) References Cited

U.S. PATENT DOCUMENTS

| 4,687,678 | A | | 8/1987 | Lindblom |
| 5,165,899 | A | * | 11/1992 | Delaunay et al. ............. 422/180 |
| 5,205,731 | A | | 4/1993 | Reuther |

(Continued)

FOREIGN PATENT DOCUMENTS

| JP | 08067990 | A | * | 3/1996 |
| WO | 9705057 | | | 2/1997 |

OTHER PUBLICATIONS

Cerri, et al., Improved-Performance Knitted Fibre Mats as Supports for Pre-Mixed Natural Gas Catalytic Combustion, Chemical Engineering Journal, 2001, pp. 34-36, vol. 82.

Saracco, et al., Catalytic Pre-Mixed Fibre Burners, Chemical Engineering Science, 1999, pp. 24-33, vol. 54.

*Primary Examiner* — Nathan Empie

(74) *Attorney, Agent, or Firm* — Brian S. Steinberger; Phyllis K. Wood; Law Offices of Brian S. Steinberger, P.A.

(57) ABSTRACT

A method for whisker formation on the surface of aluminum-containing metallic alloy fibers and substrates provides a support structure for many technical, medical and pharmaceutical applications. The novel surface modification of metallic alloy fibers and other metallic substrates involves heating the fiber or substrate in air at temperatures ranging from approximately 800° C. to approximately 1000° C. for a period of time ranging from approximately 10 hours to approximately 100 hours to form whiskers. The use of a metal oxide coating with large ions, such as zirconium oxide, allows the formation of alumina whiskers while preserving the structural integrity of the metallic alloy substrate. Uses of the present invention include, but are not limited to an advanced catalyst support, a highly efficient filter medium, a support for implants and the like.

15 Claims, 27 Drawing Sheets

(56) References Cited

U.S. PATENT DOCUMENTS

| | | |
|---|---|---|
| 5,259,754 A | 11/1993 | Dalla Betta |
| 5,326,253 A | 7/1994 | Dalla Betta |
| 5,431,557 A | 7/1995 | Hamos |
| 5,776,419 A | 7/1998 | Ihara |
| 5,776,617 A | 7/1998 | Brady |
| 5,985,220 A | 11/1999 | Hughes |
| 2004/0001781 A1 | 1/2004 | Kumar |

* cited by examiner

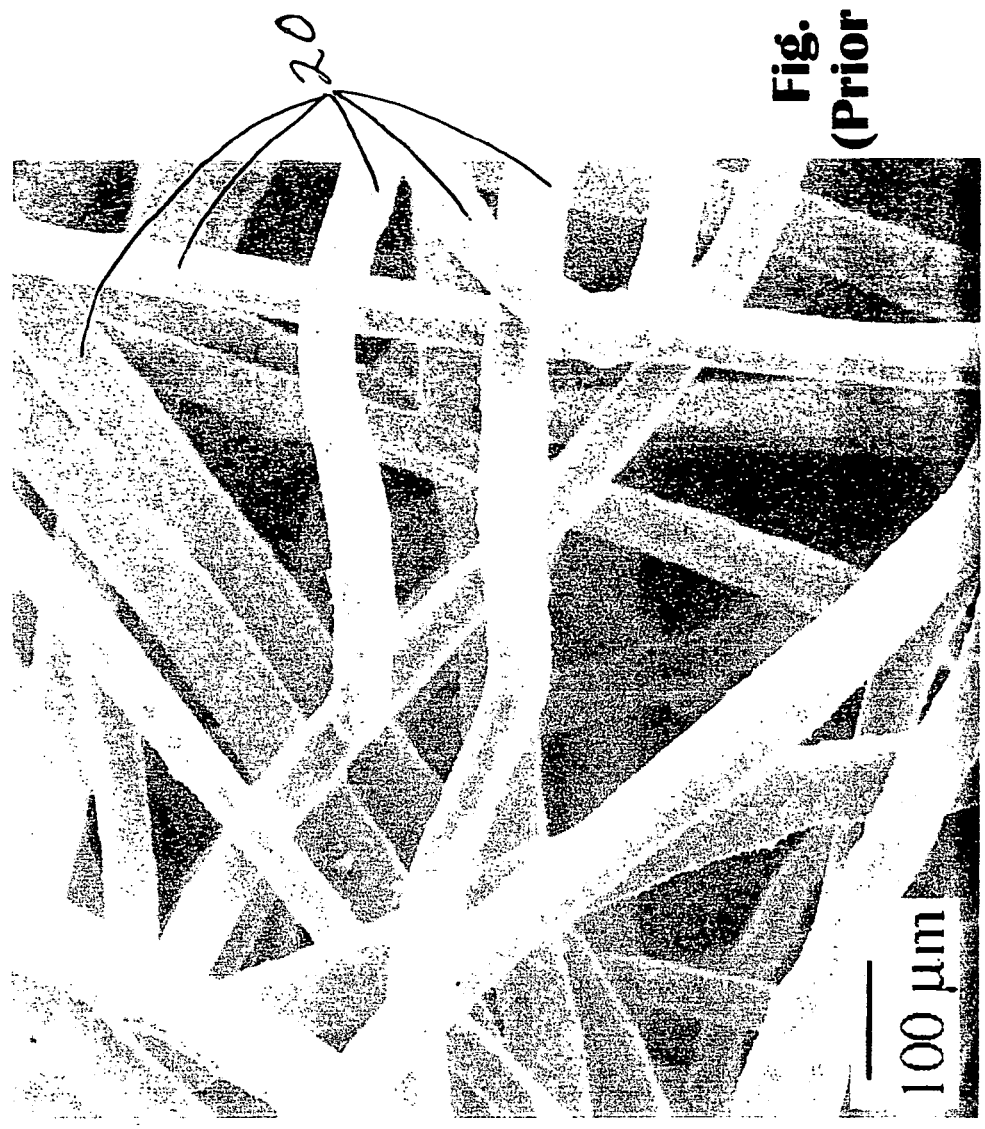

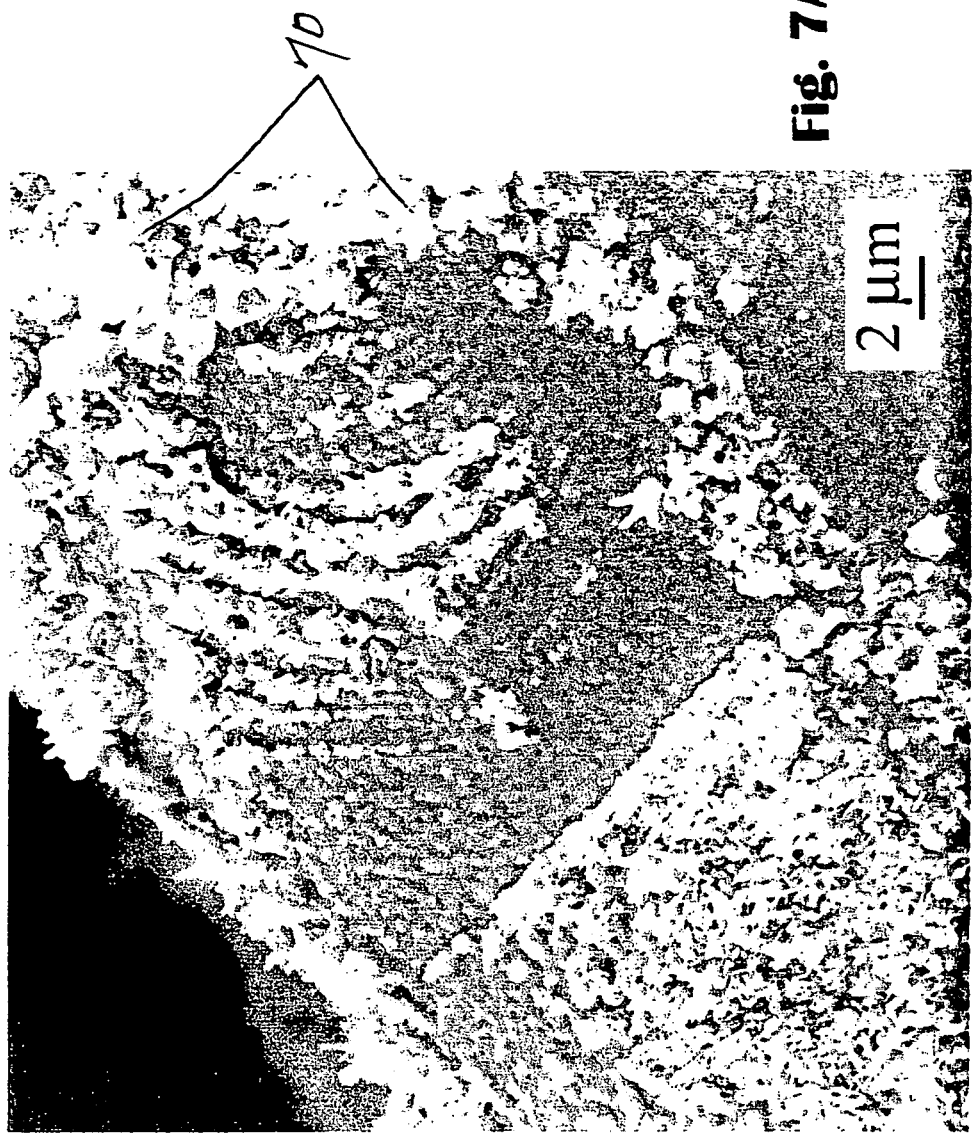

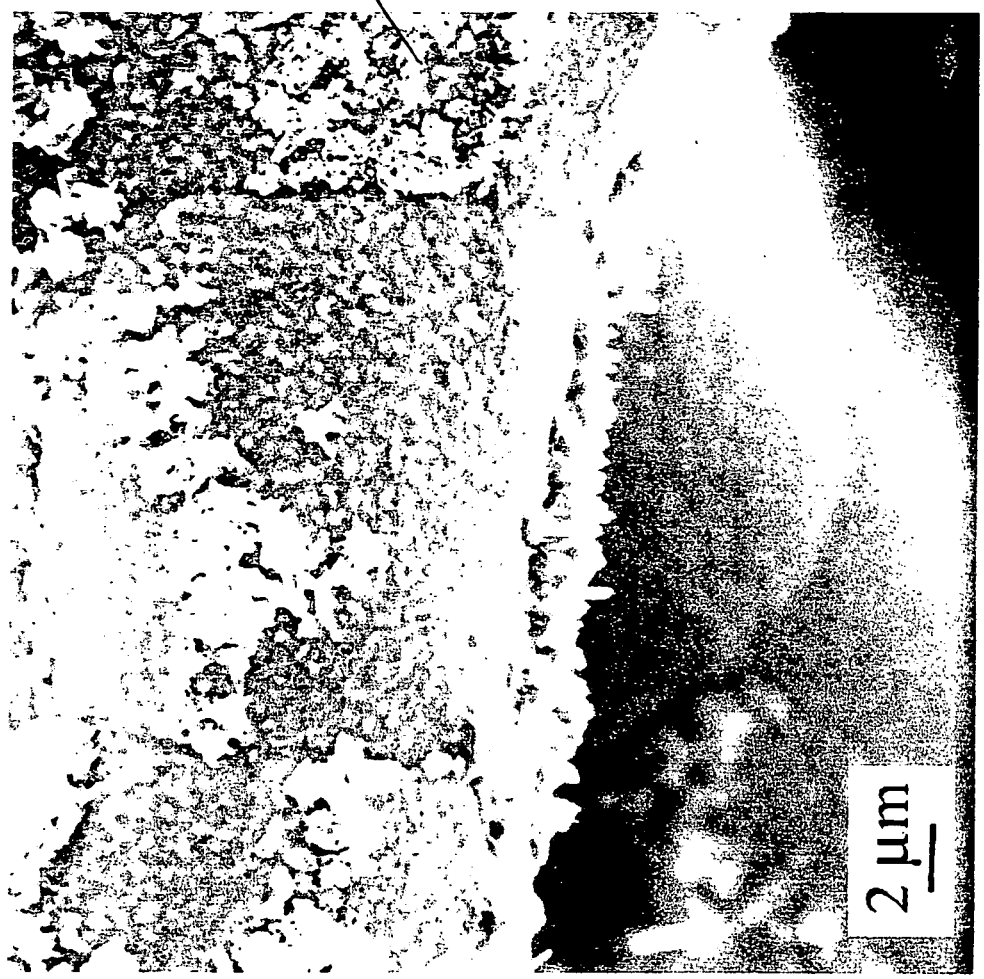

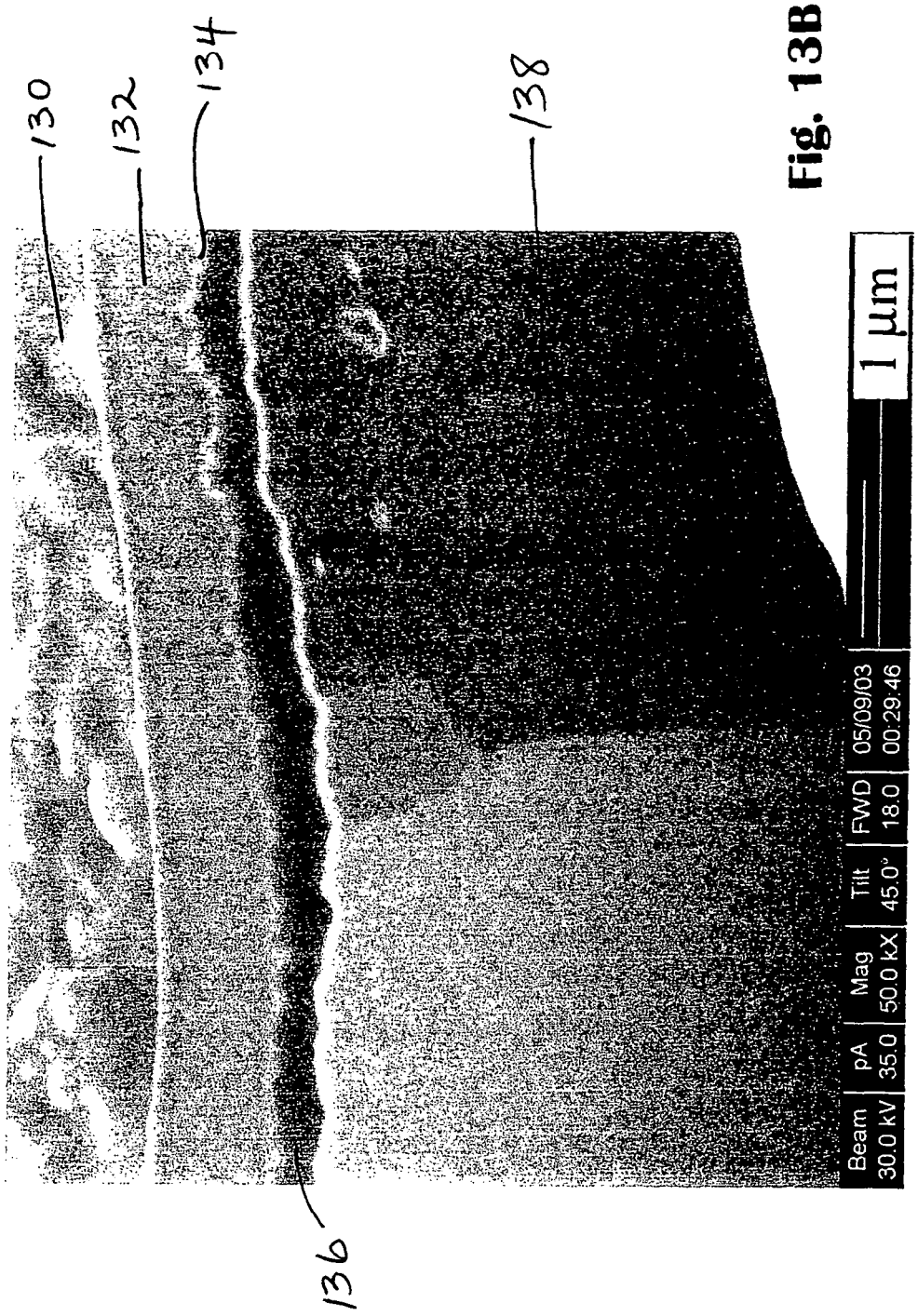

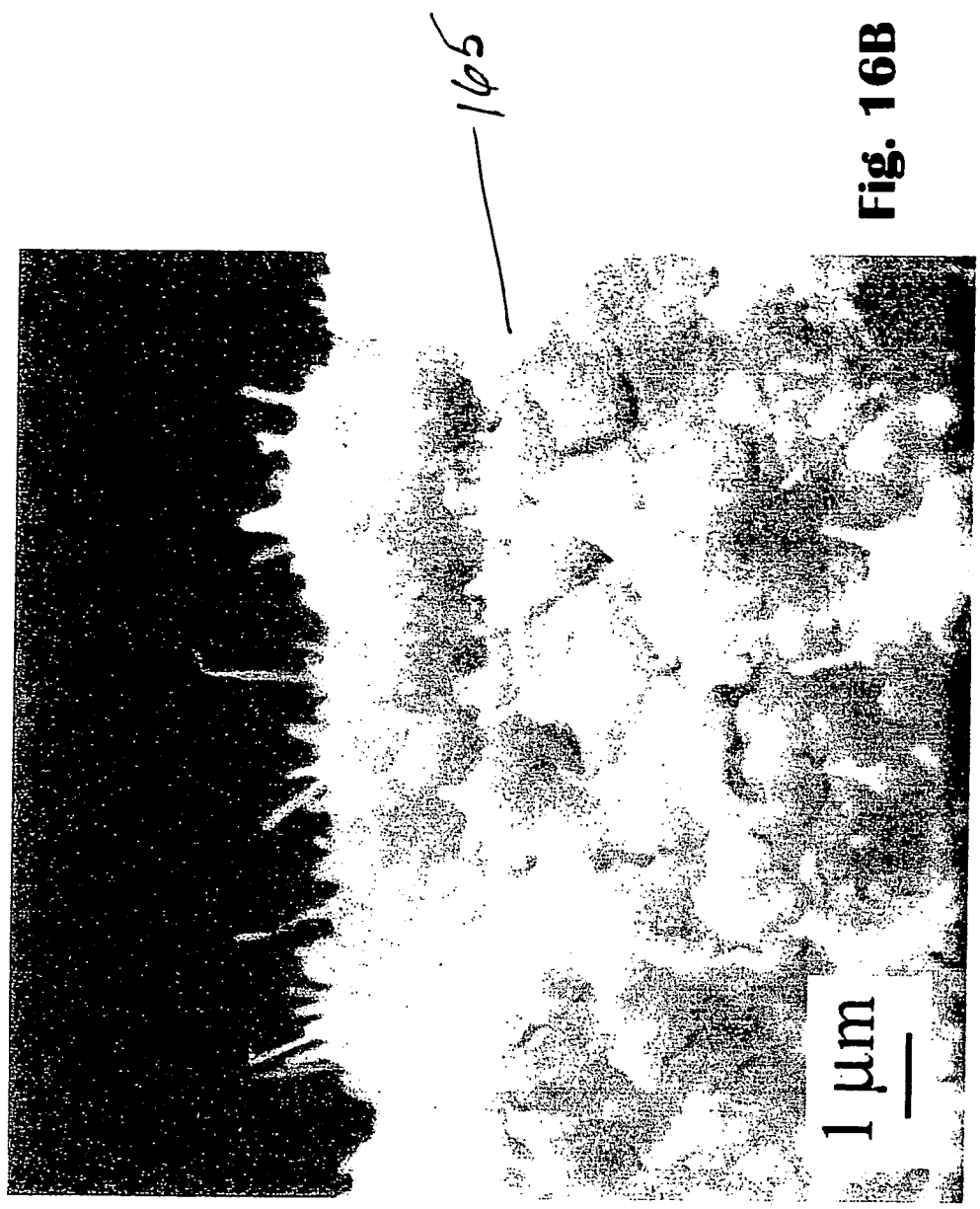

METHOD FOR WHISKER FORMATION ON METALLIC FIBERS AND SUBSTRATES

This invention is a Divisional Application of U.S. patent application Ser. No. 13/224,848 filed Sep. 2, 2011, now U.S. Pat. No. 8,247,034, which is a Divisional Application of U.S. patent application Ser. No. 11/135,987 filed May 24, 2005, now U.S. Pat. No. 8,084,096, which claims priority based on U.S. Provisional Patent Application Ser. No. 60/573,818 filed on May 24, 2004. The entire disclosure of each of the applications listed in this paragraph are incorporated herein by specific reference thereto.

FIELD OF THE INVENTION

This invention relates to the modification and use of metal fibers and substrates and, more particularly, to a method for whisker formation on metal fibers and metal surfaces for technical, medical and pharmaceutical applications.

BACKGROUND AND PRIOR ART

The current art for catalytic coating of metallic fibers is reported by Cerri, et al. in *Chemical Engineering Science* Vol. 54 (1999) "Catalytic pre-mixed fibre burners" pages 3599-3608, as depositing $LaMnO_3$ catalyst by spray pyrolysis on sintered FeCrAl fiber media for natural gas catalytic combustion. Also, G. Saracco, et al. in *Chemical Engineering Journal* Vol. 82 (2001), "Improved-Performance Knitted Fibre Mats as Supports for Pre-mixed Natural Gas Catalytic Combustion" pages 73-85 reports a similar coating technique for catalytic pre-mixed fiber burners. However, the adherence of the catalyst to fiber substrate is not good or reliable. It is desirable to have secure adherence of catalysts to substrate and a greatly increased catalytic surface area for increased efficiency.

In addition to the above, the formation of metallic alloy fibers, such as, FeCrAl and FeCrAlY are reported in U.S. Pat. No. 5,205,731 with no mention or suggestion that creating whiskers on the alloy fibers would be beneficial. Use of nested FeCrAl and FeCrAlY fibers in gas combustion systems are also reported in European Patent Appl. 0,157,432 to BV Maatschappij, et al., which also does not mention forming whiskers on the surface of alloy fibers as beneficial. To the contrary, surface modification of Fe—Cr—Al—Y that result in intensive whisker formation, due to fast growing metastable phases such as gamma or theta alumina, characteristics of aluminum outward growth is known to rapidly deplete aluminum and greatly reduce the lifetime of FeCrAl metal alloy fibers.

None of the prior art references use a process for forming whiskers on a metallic alloy fiber. Also, none of the prior art references deposit a catalyst layer on whiskers formed on a FeCrAl metal alloy fiber surface. Thus, the novel products of the present invention meet a commercial need for products and systems useful in technical, medical and pharmaceutical applications, such as, cleaning exhaust gases in power plants, in petrochemical and chemical plants, in automobile catalytic converters, filtration systems using particulate filters, polymer filtration, catalyst recovery burners, industrial gas filtration, liquid filtration, catalyst and implant supports, and the like.

SUMMARY OF THE INVENTION

It is a primary objective of the present invention to provide finely whiskered metallic alloy fibers and substrates with a greatly increased total surface area.

A second objective of the present invention is to provide an advanced catalyst support from a metallic alloy fiber or substrate with a greatly increased total surface area.

A third objective of the present invention is to provide a surface modified metallic alloy fiber and substrate that is a highly efficient filter and can be used for submicron size particle removal.

A fourth objective of the present invention is to provide a whiskered metallic fiber or substrate that is a good host for catalysts.

A fifth objective of the present invention is to provide finely whiskered FeCrAl and FeCrAlY fibers coated with a catalyst.

A preferred method for forming whiskers on the surface of an aluminum-containing metallic alloy substrate includes coating a layer of metal oxide on the surface of a metallic alloy substrate; then heating the coated metallic alloy substrate at temperatures between approximately 800° C. to approximately 1000° C. and for a period of time between approximately 10 hours to approximately 100 hours to form alumina whiskers on the surface of the metallic substrate.

The preferred aluminum-containing metallic alloy substrate has the formula MCrAlX, where M is at least one of iron (Fe), nickel (Ni) and cobalt (Co), Cr is chromium, Al is aluminum and X is at least one of yttrium (Y), zirconium (Zr), hafnium (Hf) and ytterbium (Yb). The more preferred aluminum-containing metallic alloy substrates are FeCrAl and FeCrAlY. and the preferred metallic alloy substrate is a fiber.

The preferred metal oxide coating is zirconium oxide, cerium oxide, hafnium oxide and lanthanum oxide, more preferably, zirconium oxide.

A preferred method of producing an advanced catalyst system includes, preparing a whiskered aluminum-containing metallic alloy substrate, and depositing a catalyst layer on the whiskered surface using a dip coating technique to strongly adhere the catalysts to the whiskered substrate.

The preferred catalyst layer consists of mixtures of noble metals, including palladium, platinum, rhodium and mixtures thereof; also, metal oxides, including aluminum oxide, zirconium oxide, cerium oxide and mixtures thereof.

The preferred whiskered aluminum-containing metallic alloy substrate is a fiber.

Another preferred method for forming whiskers on the surface of an aluminum-containing metallic alloy substrate includes heating the metallic alloy substrate at oxidation temperatures from approximately 800° C. to approximately 1000° C. and for a period of time between approximately 10 hours to approximately 100 hours to form alumina whiskers on the surface of the metallic substrate, thereby increasing the total surface area of the metallic alloy substrate during oxidation.

The preferred aluminum-containing metallic alloy substrate has the formula MCrAlX, where M is at least one of iron (Fe), nickel (Ni) and cobalt (Co), Cr is chromium, Al is aluminum and X is at least one of yttrium (Y), zirconium (Zr), hafnium (Hf) and ytterbium (Yb). The preferred aluminum-containing metallic alloy substrates are FeCrAl and FeCrAlY. The preferred metallic alloy substrate is a fiber.

Preferred embodiments of the invention include a two-step process consisting of preparing a whisker formation on metal alloy fibers, then depositing a catalyst layer on the whiskered surface. The catalytic coating on the whiskered metal alloy surface provides dual benefits for filtration and catalytic activity. The fine whiskers greatly increase the total surface area of the fiber or alloy substrate medium to improve filtration efficiency, especially small particle removal. In addition, the whiskered fiber or substrate medium is a good host for catalysts, which are useful in applications, such as, hot gas cleaning and catalytic converters. Due to the existence of the fine whiskers, the adherence of the catalyst is greatly strengthened, which is useful in harsh environment where thermal shock or strong vibration is an issue.

Further objects and advantages of this invention will be apparent from the following detailed description of the presently preferred embodiments, which are illustrated schematically in the accompanying drawings.

BRIEF DESCRIPTION OF THE FIGURES

FIG. 2A is a scanning electron micrograph (scale 100 µm) of FeCrAlY fibers in a woven structure. (Prior Art)

FIG. 7A a scanning electron micrograph (scale 2 µm) of 25 micrometer (µm) FeCrAlY fibers after oxidation for 200 hours at a temperature of approximately 850° C., a top view.

FIG. 7B is a scanning electron micrograph (scale 2 µm) of 25 micrometer (µm) FeCrAlY fibers after oxidation for 200 hours at a temperature of approximately 850° C., a side view.

FIG. 13B is a Focused Ion Beam cross section (1 µm scale) of 25 micrometer (µm) FeCrAlY fibers, coated with $TiO_2$, after oxidation for approximately 200 hours at a temperature of approximately 915° C.

FIG. 16B is a scanning electron micrograph (1 µm scale) of 25 micrometer (µm) finely whiskered FeCrAlY fibers after catalyst coating.

DESCRIPTION OF THE PREFERRED EMBODIMENTS

Figure 1:
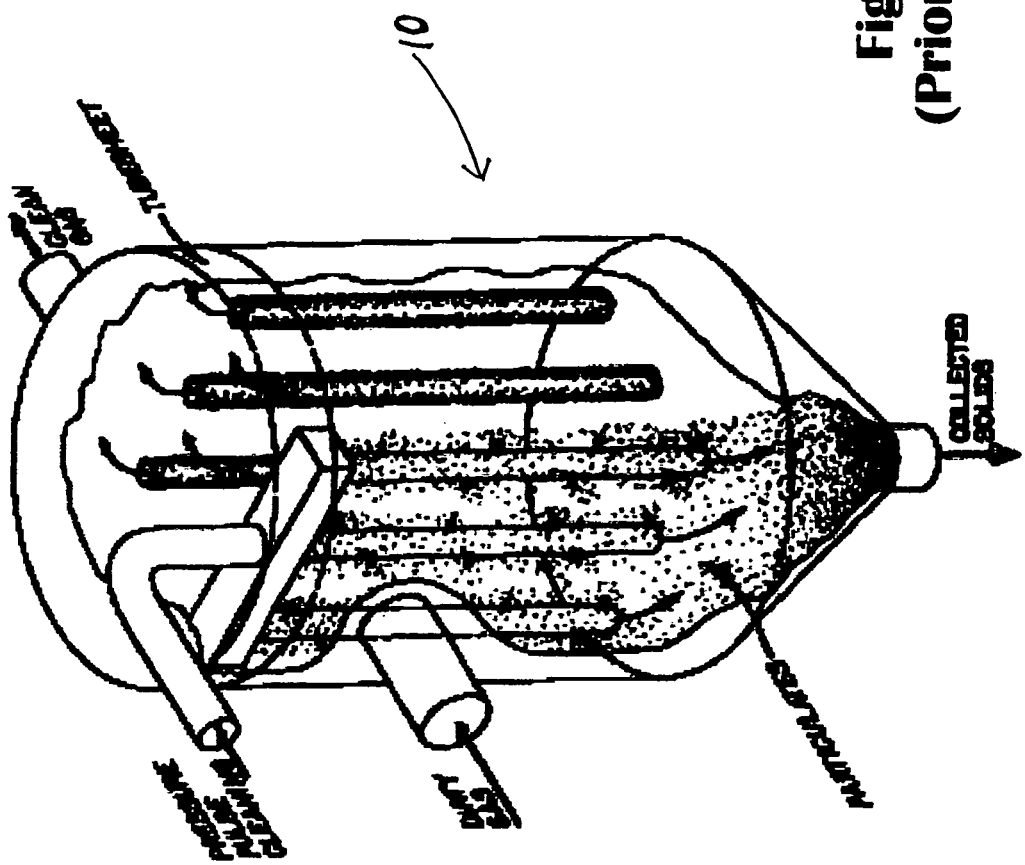
FIG. 1 is a hot gas candle filter that operates at temperatures from approximately 650° C. to approximately 900° C. (Prior Art)

Before explaining the disclosed embodiments of the present invention in detail, it is to be understood that the invention is not limited in its application to the details of the particular arrangements shown since the invention is capable of further embodiments. Also, the terminology used herein is for the purpose of description and not of limitation According to the present invention, the objectives stated above are met by making fine whiskers to greatly increase the total surface area of a metal alloy fiber or substrate medium, then coating the whiskered surface of the fiber or alloy substrate with a catalytic coating. The novel fibers and alloy substrate of the present invention can be used in conventional filtration devices, such as, but not limited to, a hot gas candle filter 10 as shown in FIG. 1.

Figure 2B:
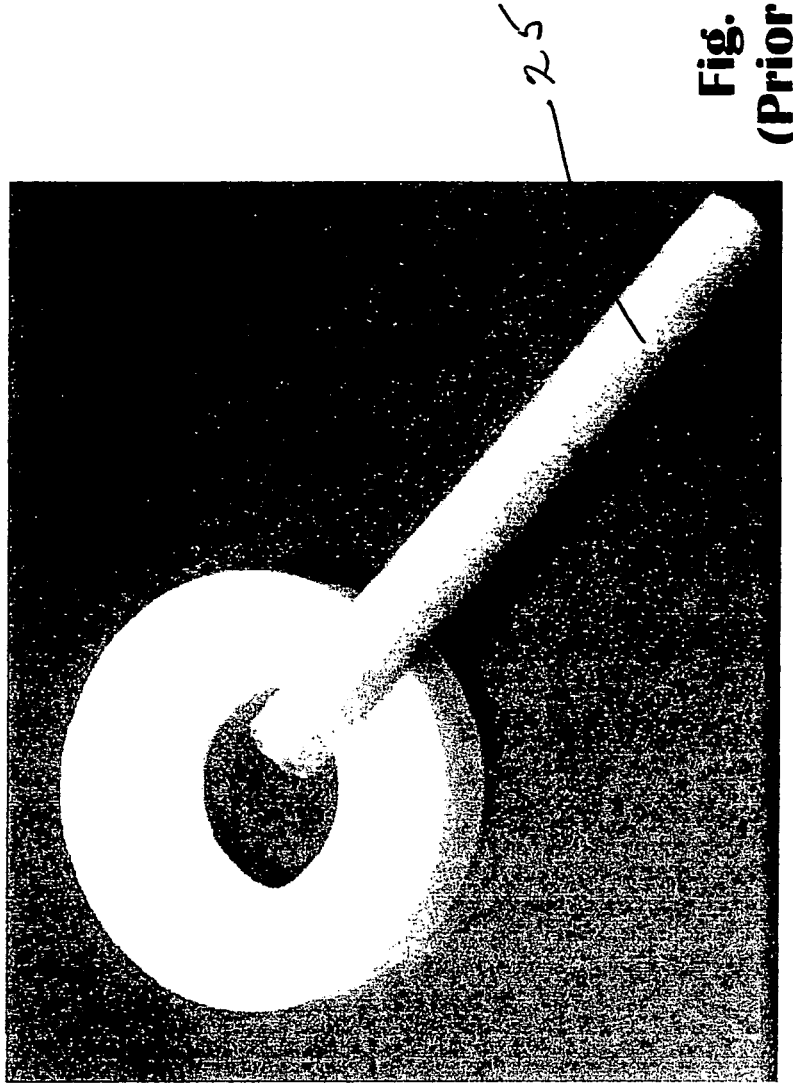
FIG. 2B is a scanning electron micrograph of a single FeCrAlY fiber. (Prior Art)

In FIG. 2A iron-chromium-aluminum-yttrium (FeCrAlY) alloy fibers 20 are shown in a scanning electron micrograph (SEM) of a conventional woven structure; and a single fiber 25 is shown in FIG. 2B. The chemical composition of the metal alloy in weight percent is: Al=7.0%, Cr=27.0%, (molybdenum) Mo=2.0%, (carbon) C=0.03%, Y=0.15% and Fe=63.82%.

The metal alloy fibers of the present invention are of the formula MCrAlX, where M is typically iron (Fe), nickel (Ni), or cobalt (Co), and X is typically an active element such as yttrium (Y), zirconium (Zr), hafnium (Hf) and ytterbium (Yb) and similar reactive elements. The weight percent range of metal alloy components is shown in the table below. However, the ranges are not a limitation of the present invention, because those skilled in the art may select any combination of metallic substances known for outstanding oxidation resistance at temperatures up to approximately 1000° C.

TABLE 1

Metal Alloy Composition

| Metal Component | Weight Percent (%) Range in Alloy |
| --- | --- |
| M (Fe, Ni, or Co) | approximately 60% to approximately 70% |
| Chromium (Cr) | approximately 20% to approximately 30% |
| Aluminum (Al) | approximately 5% to approximately 10% |
| Molybdenum (Mo) | approximately 0% to approximately 3% |
| Carbon (C), Copper (Cu) | approximately 0.02% to approximately 0.05% |
| X (Y, Zr, Hf, Yb) | approximately 0.05% to approximately 0.15% |
| Silicon (Si) | approximately 0.20% to approximately 0.40% |

For purposes of illustrating the present invention, but not as a limitation, FeCrAlY fibers having a diameter of 25 micrometers (μm) and a metal alloy composition in weight percent of: Al=7.0%, Cr=27.0%, (molybdenum) Mo=2.0%, (carbon) C=0.03%, Y=0.15% and Fe=63.82% are discussed in detail below. Fibers suitable for the process of the present invention can have a diameter that ranges from approximately 12 microns to approximately 40 microns.

Figure 3:
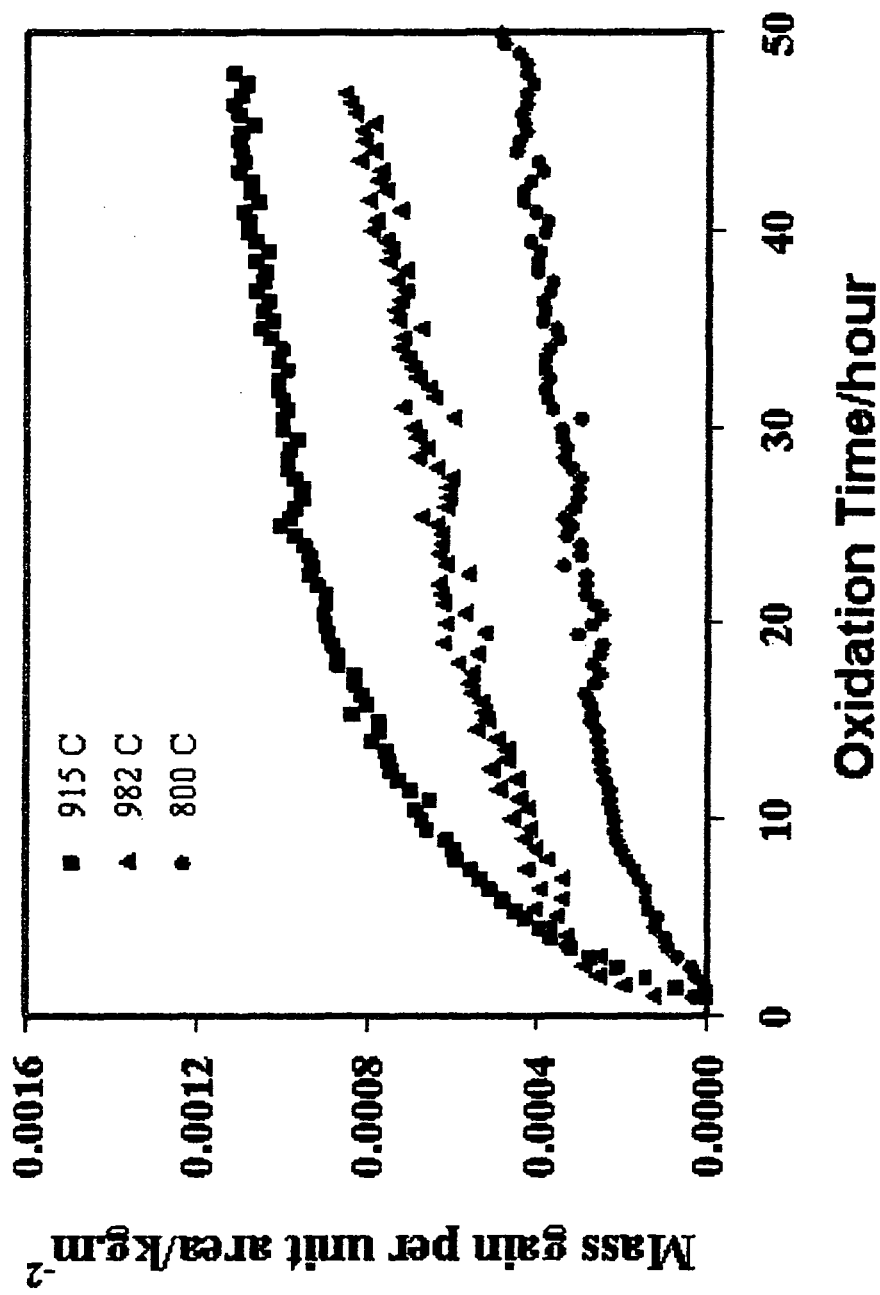
FIG. 3 shows oxidation kinetics of 25 micrometer (µm) FeCrAlY fibers at temperatures from approximately 800° C. to approximately 982° C.

FIG. 3 shows the mass gain per unit area versus time plots for oxidation of 25 μm FeCrAlY fibers at 800° C., 915° C. and 982° C. The mass gain is attributed to the formation of whiskers of alumina along the surface of the fiber. There is a greater mass gain per unit area when the metal alloy fibers are heated for 50 hours at approximately 915° C. than at the other heating temperatures. It is noted that after heating the metal alloy fibers for approximately 50 hours at approximately 982° C., there is less of a mass gain than at 915° C., indicating that there is an upper temperature limit for whisker formation.

Figure 4A:
FIG. 4A is a scanning electron micrograph (scale 5 µm) of 25 micrometer (µm) FeCrAlY fibers after oxidation for 50 hours at a temperature of approximately 982° C.
Figure 4B:
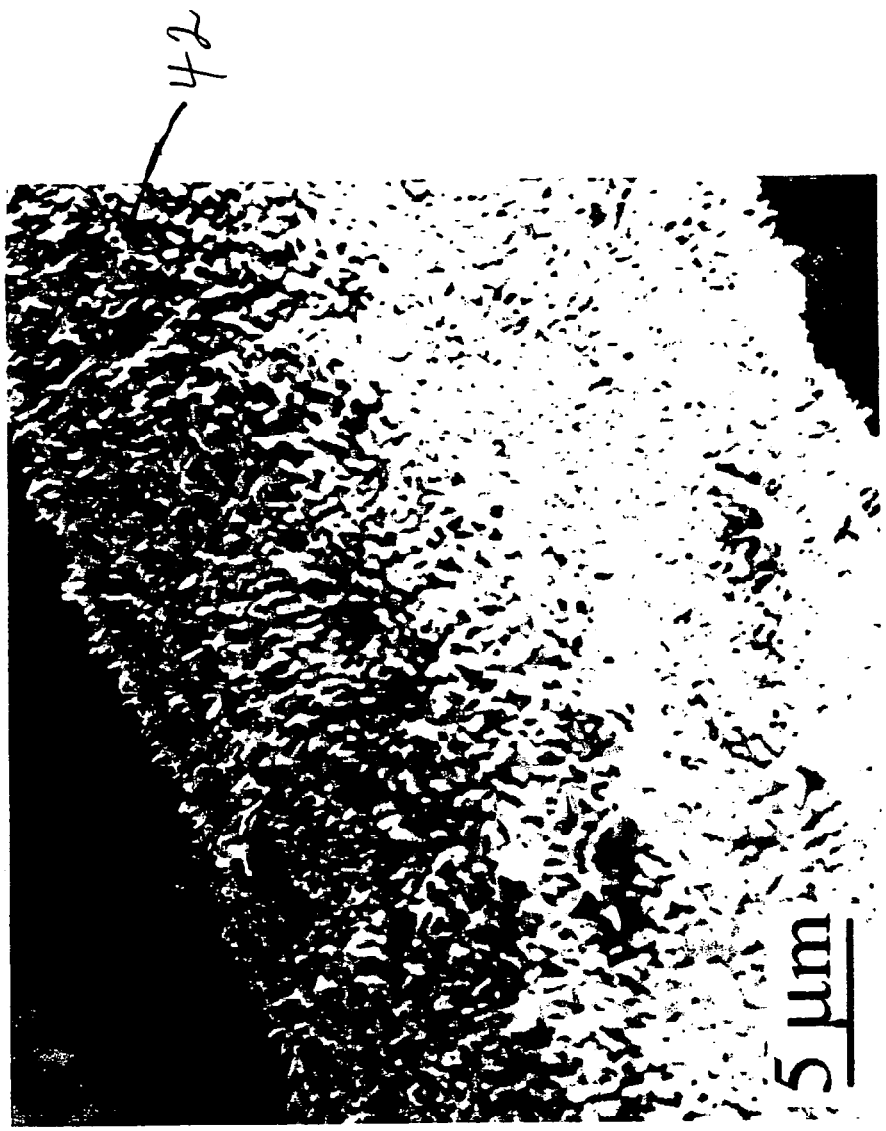
FIG. 4B is a scanning electron micrograph (scale 5 µm) of 25 micrometer (µm) FeCrAlY fibers after oxidation for 50 hours at a temperature of approximately 915° C.
Figure 4C:
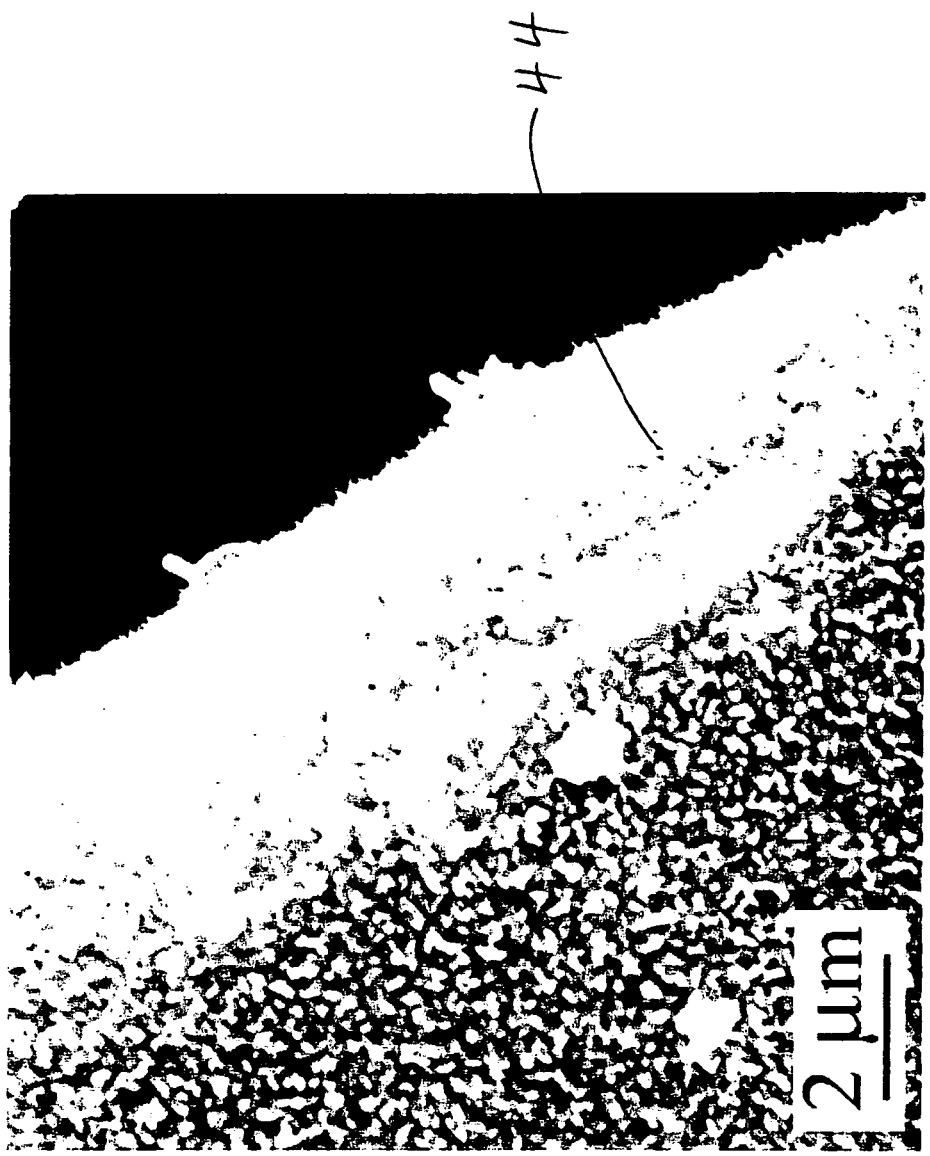
FIG. 4C is a scanning electron micrograph (scale 2 µm) of 25 micrometer (µm) FeCrAlY fibers after oxidation for 50 hours at a temperature of approximately 800° C.

FIG. 4A is a scanning electron micrograph of 25 μm FeCrAlY fibers 40 after oxidation for 50 hours at 982° C. showing very little whisker formation along the fiber surface. Whereas, in FIG. 4B, the scanning electron micrograph of a 25 μm FeCrAlY fiber 42 after oxidation for 50 hours at 915° C. shows intensive whisker formation. FIG. 4C is a higher magnification (SEM) of the fiber surface showing initial whisker formation on a 25 μm FeCrAlY fiber 44 after oxidation for 50 hours at 800° C.

Figure 5:
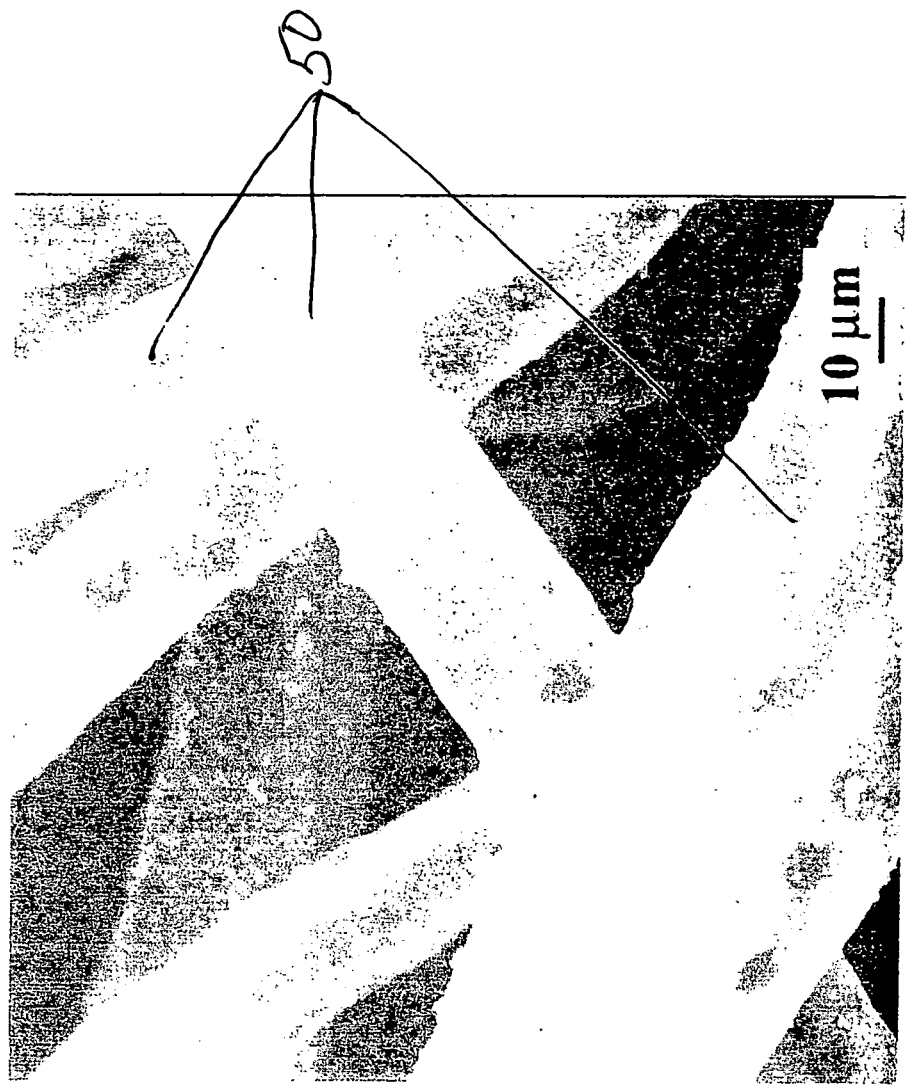
FIG. 5 is a scanning electron micrograph (scale 10 µm) of 25 micrometer (µm) FeCrAlY fibers after oxidation for 50 hours at a temperature of approximately 950° C.

FIG. 5 is an overall view of several 25 μm FeCrAlY fibers 50 after oxidation for 50 hours at 950° C. with significant alumina whisker formation.

Figure 6A:
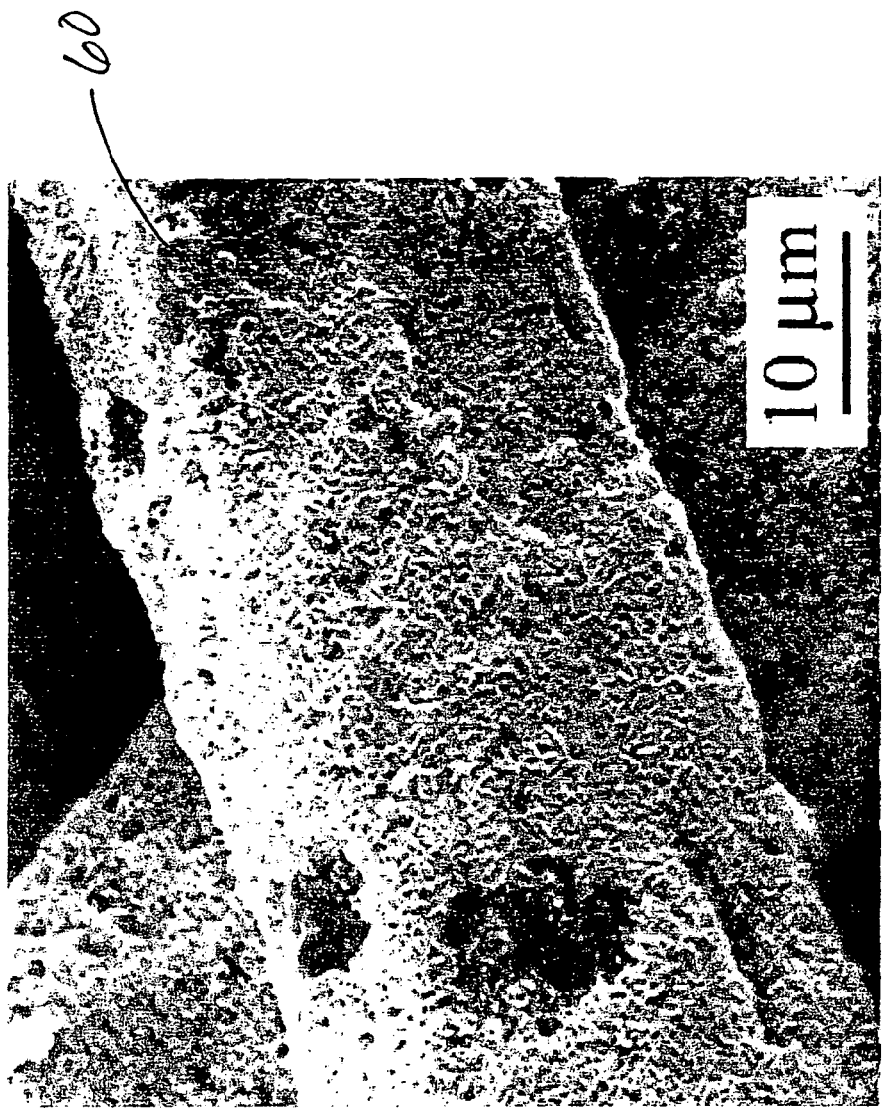
FIG. 6A is a scanning electron micrograph (scale 10 µm) of 25 micrometer (µm) FeCrAlY fibers after oxidation for 200 hours at a temperature of approximately 915° C.
Figure 6B:
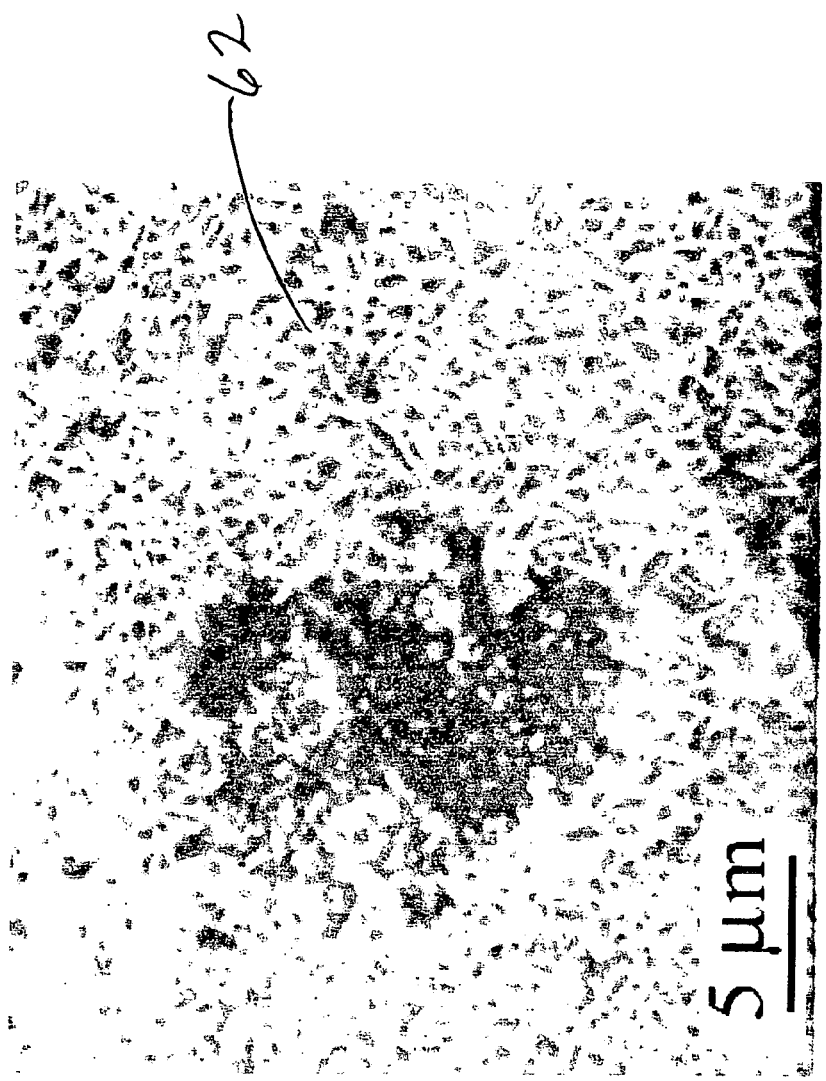
FIG. 6B is a scanning electron micrograph (scale 5 µm) of 25 micrometer (µm) FeCrAlY fibers after oxidation for 200 hours at a temperature of approximately 915° C.
Figure 6C:
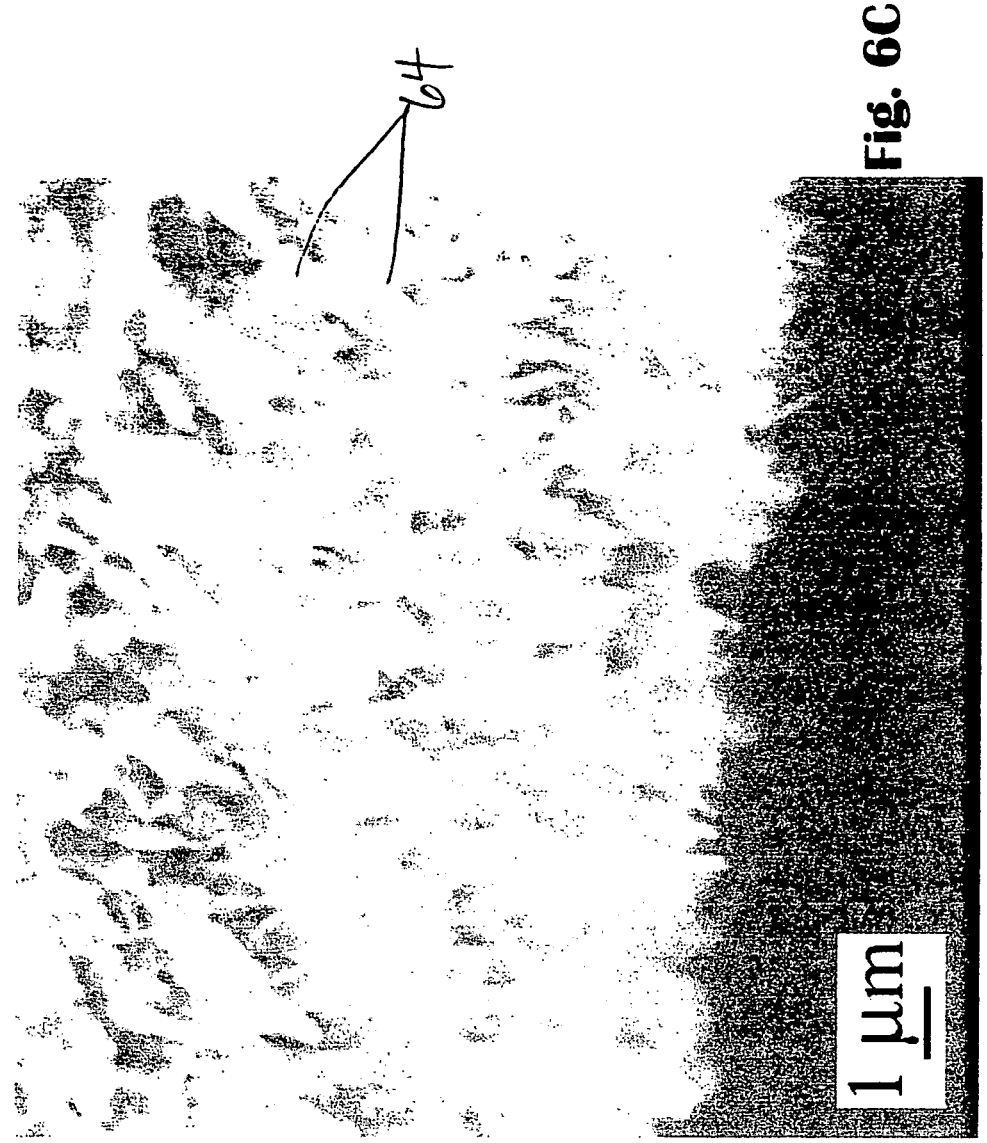
FIG. 6C is a scanning electron micrograph (scale 1 µm) of 25 micrometer (µm) FeCrAlY fibers after oxidation for 200 hours at a temperature of approximately 915° C.

FIGS. 6A, 6B and 6C show different magnifications (SEMs) of 25 μm FeCrAlY fibers after oxidation for 200 hours at 915° C. FIG. 6A shows a fiber 60 at a magnification scale of 10 μm; FIG. 6B is a fiber 62 at a magnification scale of 5 μm and FIG. 6C is a zoomed view (1 μm scale) of a fiber 64 giving an excellent view of the alumina whisker formation.

Scanning electron micrographs show a top view (FIG. 7A) and side view (FIG. 7B) of 25 μm FeCrAlY fibers 70 and 72, respectively, after oxidation for 200 hours at 850° C. The zoomed views (scale=2 μm) show intensive whisker coverage of FeCrAlY fibers.

Figure 8A:
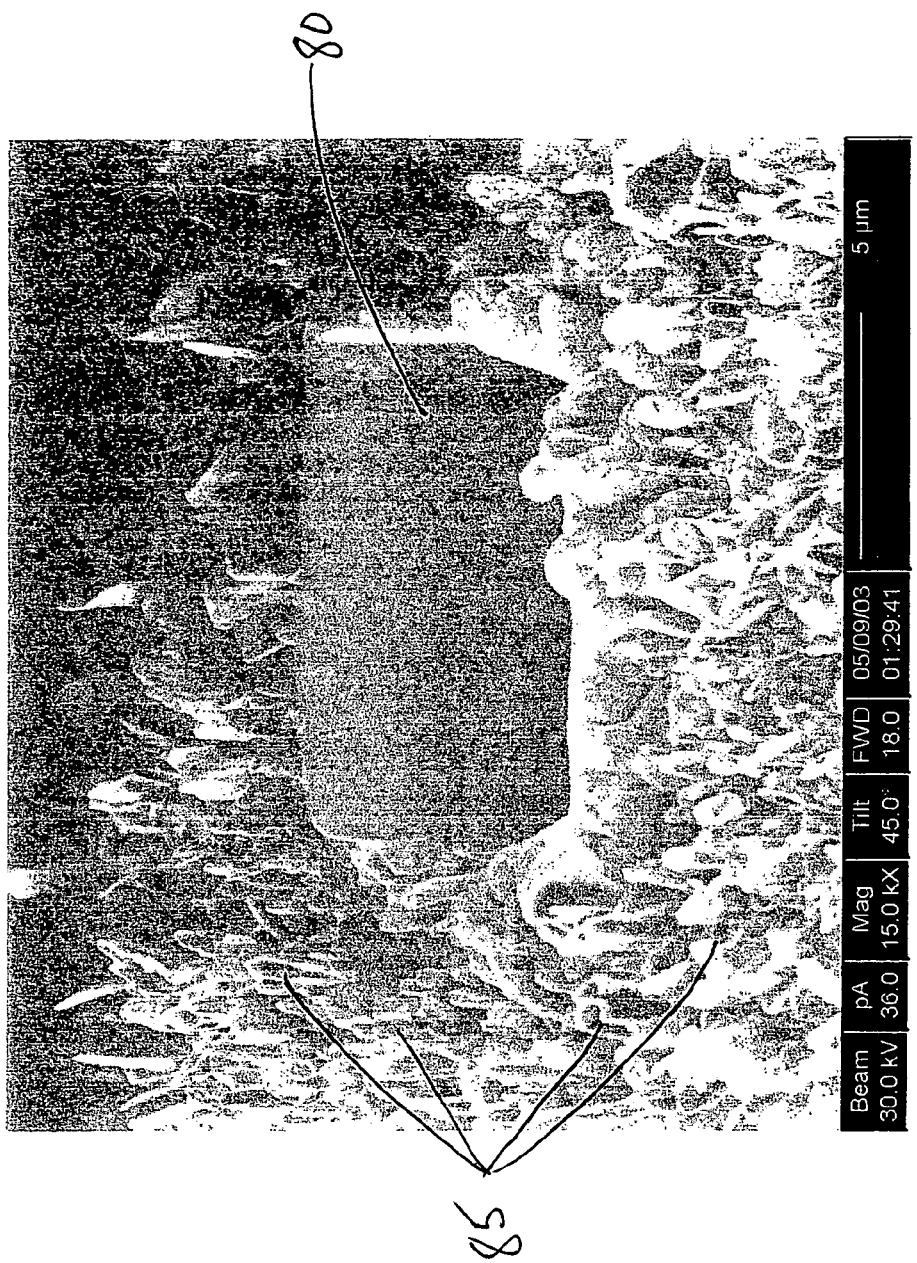
FIG. 8A is a Far Infrared Beam (FIB) cross section (5 µm scale) of 25 micrometer (µm) FeCrAlY fibers after oxidation for 200 hours at a temperature of approximately 915° C.
Figure 8B:
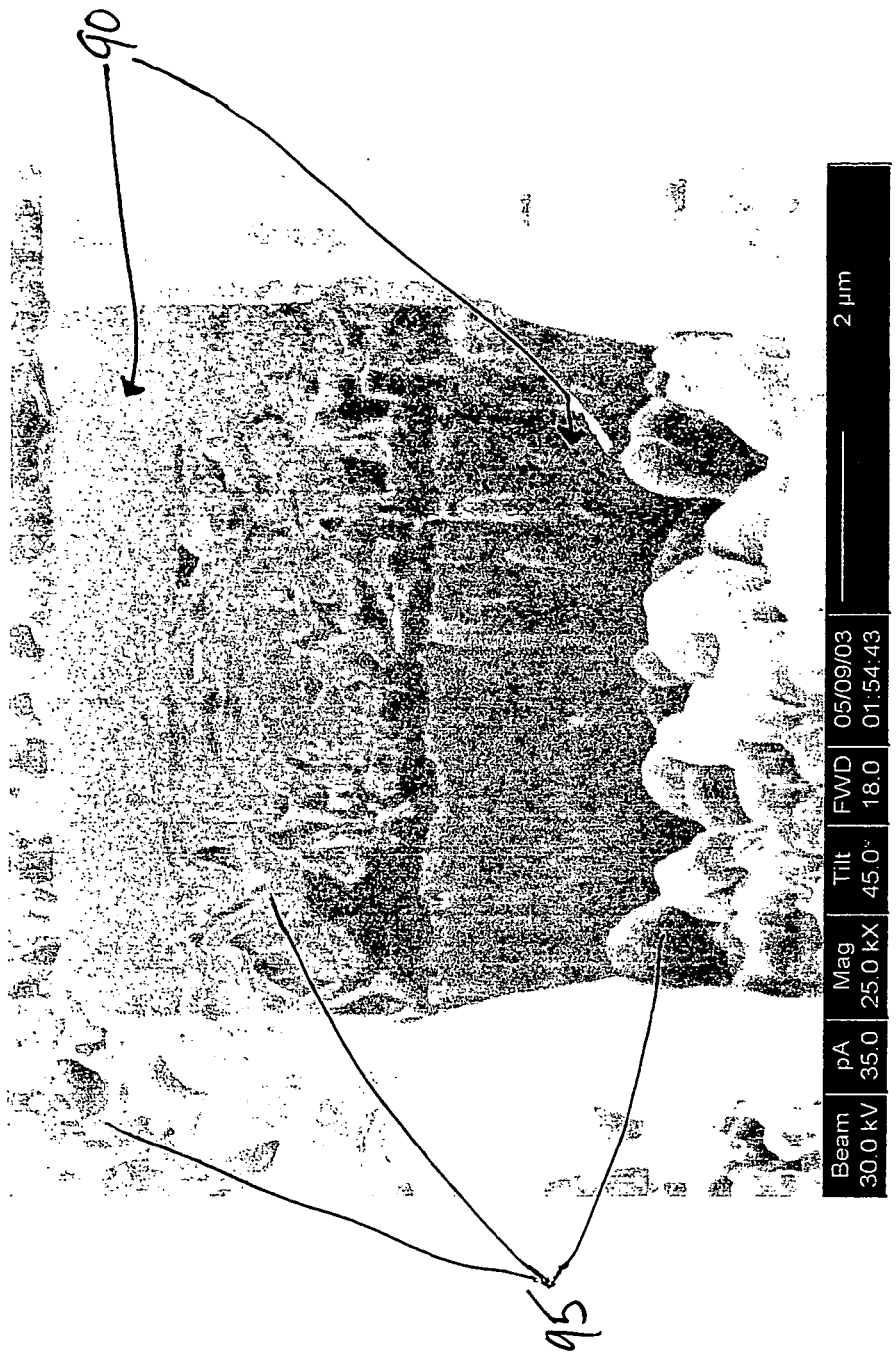
FIG. 8B is a Far Infrared Beam (FIB) cross section (2 µm scale) of 25 micrometer (µm) FeCrAlY fibers after oxidation for 200 hours at a temperature of approximately 915° C.

FIG. 8A is a focused ion beam cross section of 25 μm FeCrAlY fibers after oxidation for 200 hours at 915° C. At ion energy of 30.0 kV, beam current of 35.0 pA, and magnification of 15.0 kX, interfacial voids 80 and alumina whiskers 85 are shown in a cross-sectional view. FIG. 8B is a zoomed view, with magnification of 25.0 kX, of a focused ion beam cross section of 25 μm FeCrAlY fibers oxidized under the same conditions as if FIG. 8A with interfacial voids 90 and alumina whiskers 95. The voids show the underlying metallic platinum substrate and alloy substrate.

It should be noted here that the focused ion beam (FIB) offers clean delineation of oxidized fiber structure and provides more precise measurements of alumina whiskers.

FIGS. 3 to 8B confirm the conditions that support whisker formation on FeCrAlY; fine fibers occur when the fibers are heated at temperatures from approximately 850° C. to approximately 950° C. for from approximately 50 hours to approximately 200 hours. However, fast growing meta-stable phases, such as gamma or theta alumina, characteristics of aluminum outward growth are to be avoided because the fast depletion of aluminum greatly reduces the lifetime of these metal alloy fibers.

Experiments with various coatings on the FeCrAlY fibers were designed to inhibit the growth of meta-stable alumina phases.

EXAMPLE 1

Coatings with Small Ion Oxides

Figure 9:
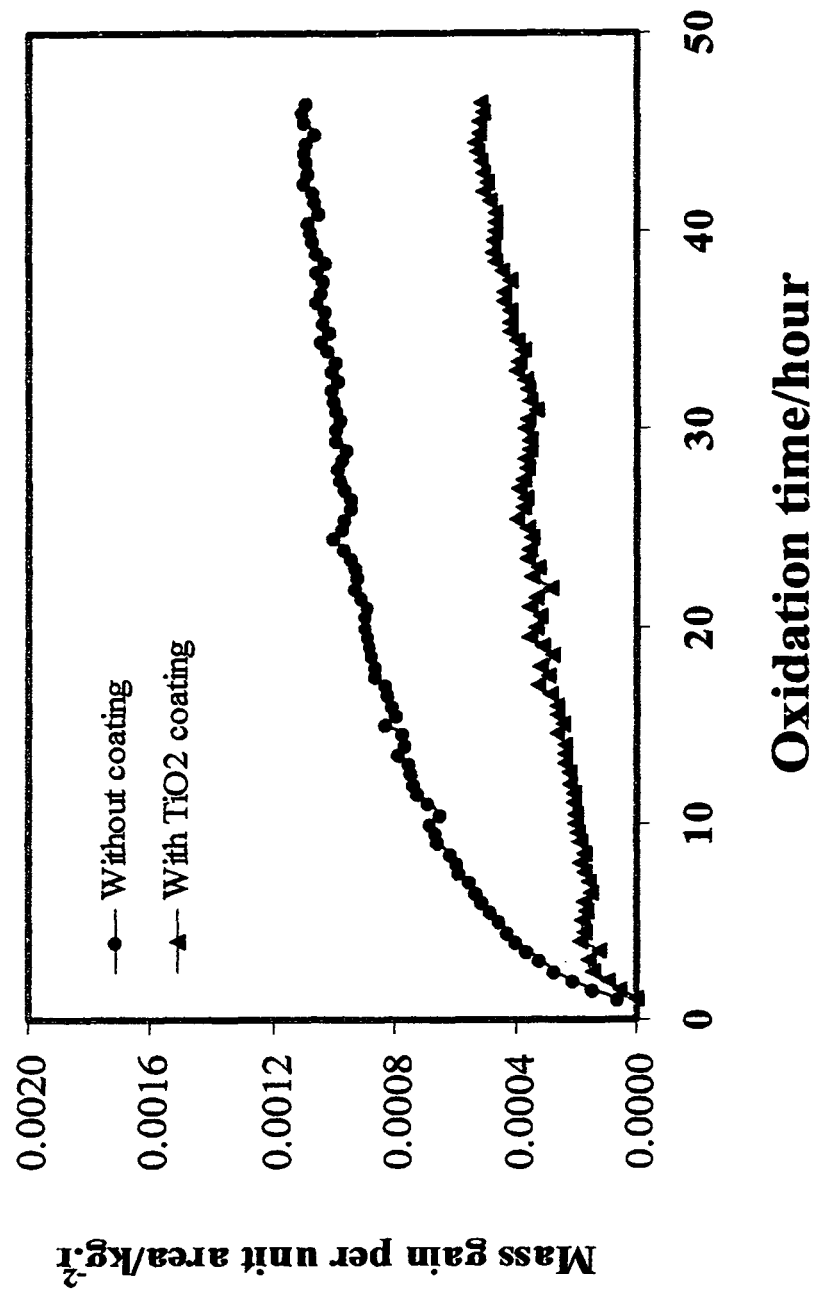
FIG. 9 shows oxidation kinetics for 25 micrometer (µm) FeCrAlY fibers at approximately 915° C. under bare, and $TiO_2$ coated conditions for approximately 50 hours.
Figure 10A:
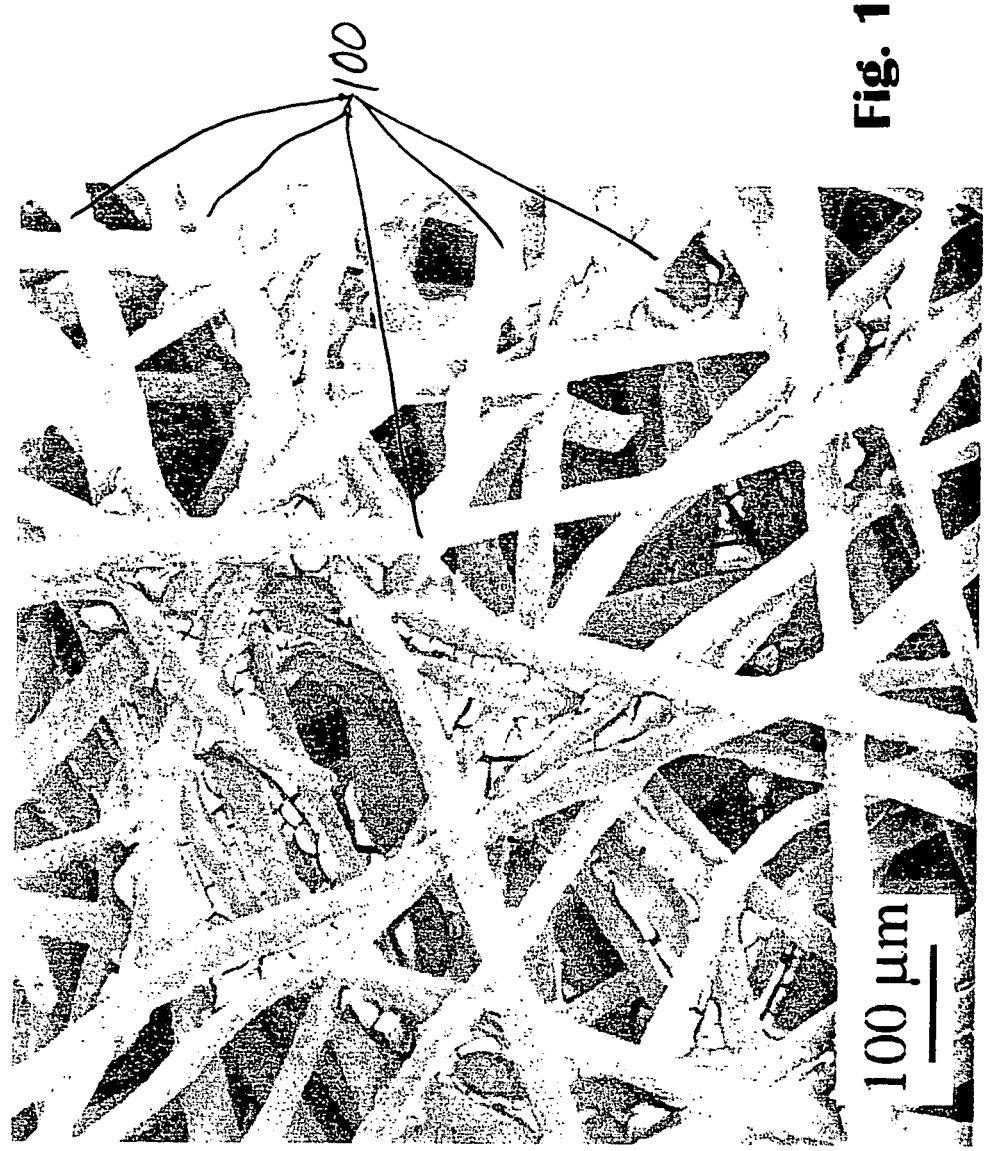
FIG. 10A is a scanning electron micrograph (100 µm scale) of 25 micrometer (µm) FeCrAlY fibers, with titanium dioxide ($TiO_2$) coating, after firing.
Figure 10B:
FIG. 10B is a scanning electron micrograph (5 µm scale) of 25 micrometer (µm) FeCrAlY fibers, showing coating cracks due to liquid hold up.
Figure 11:
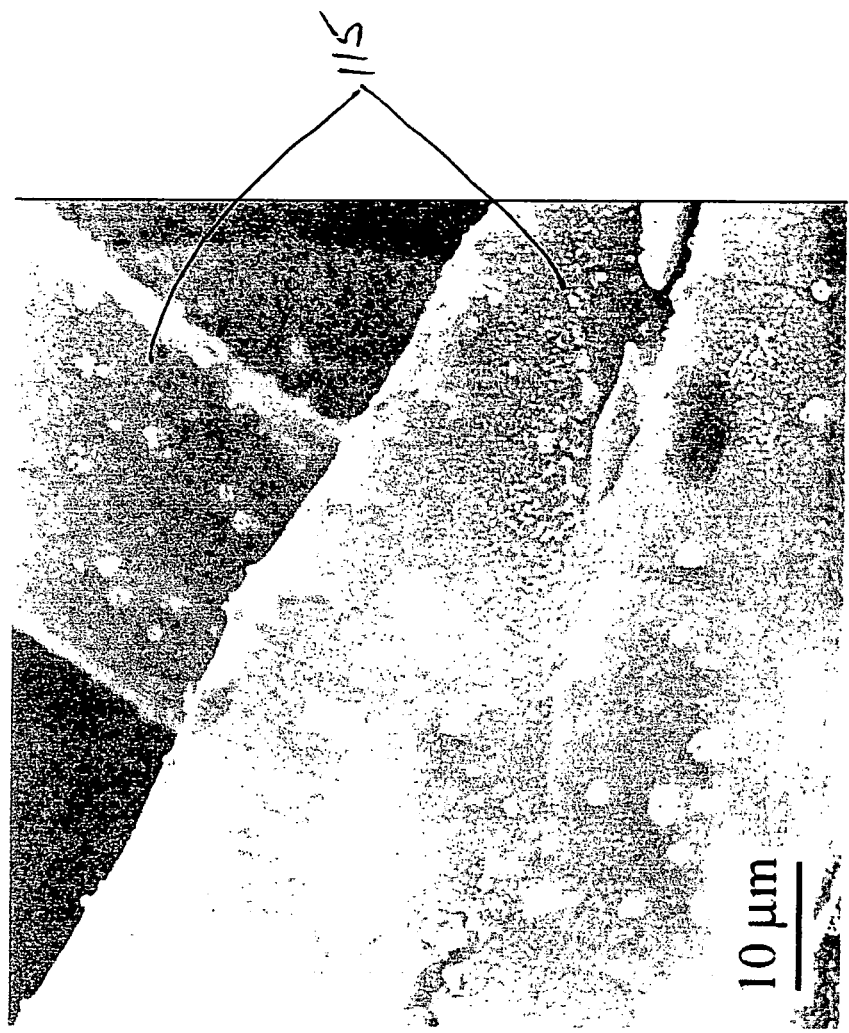
FIG. 11 is a scanning electron micrograph (10 µm scale) of 25 micrometer (µm) FeCrAlY fibers, coated with $TiO_2$ and oxidized for approximately 200 hours at approximately 915° C.
Figure 12:
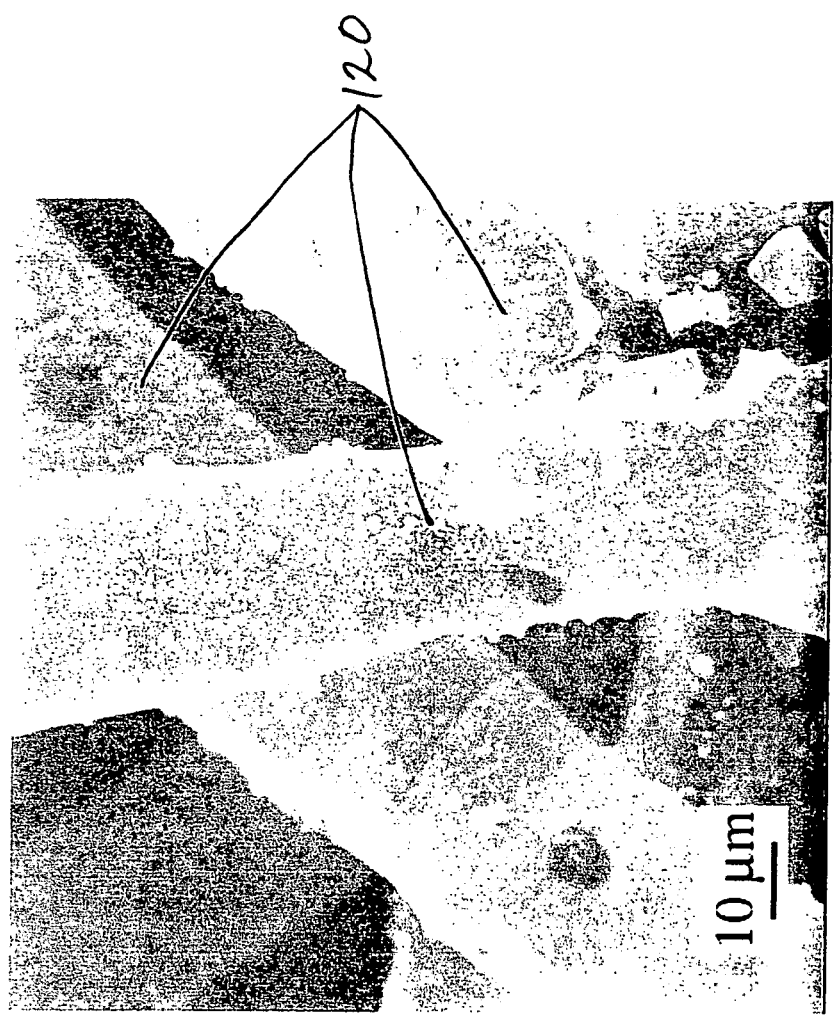
FIG. 12 is a scanning electron micrograph (10 µm scale) of 25 micrometer (µm) FeCrAlY fibers, coated with $TiO_2$ and oxidized for approximately 200 hours at approximately 850° C.
Figure 13A:
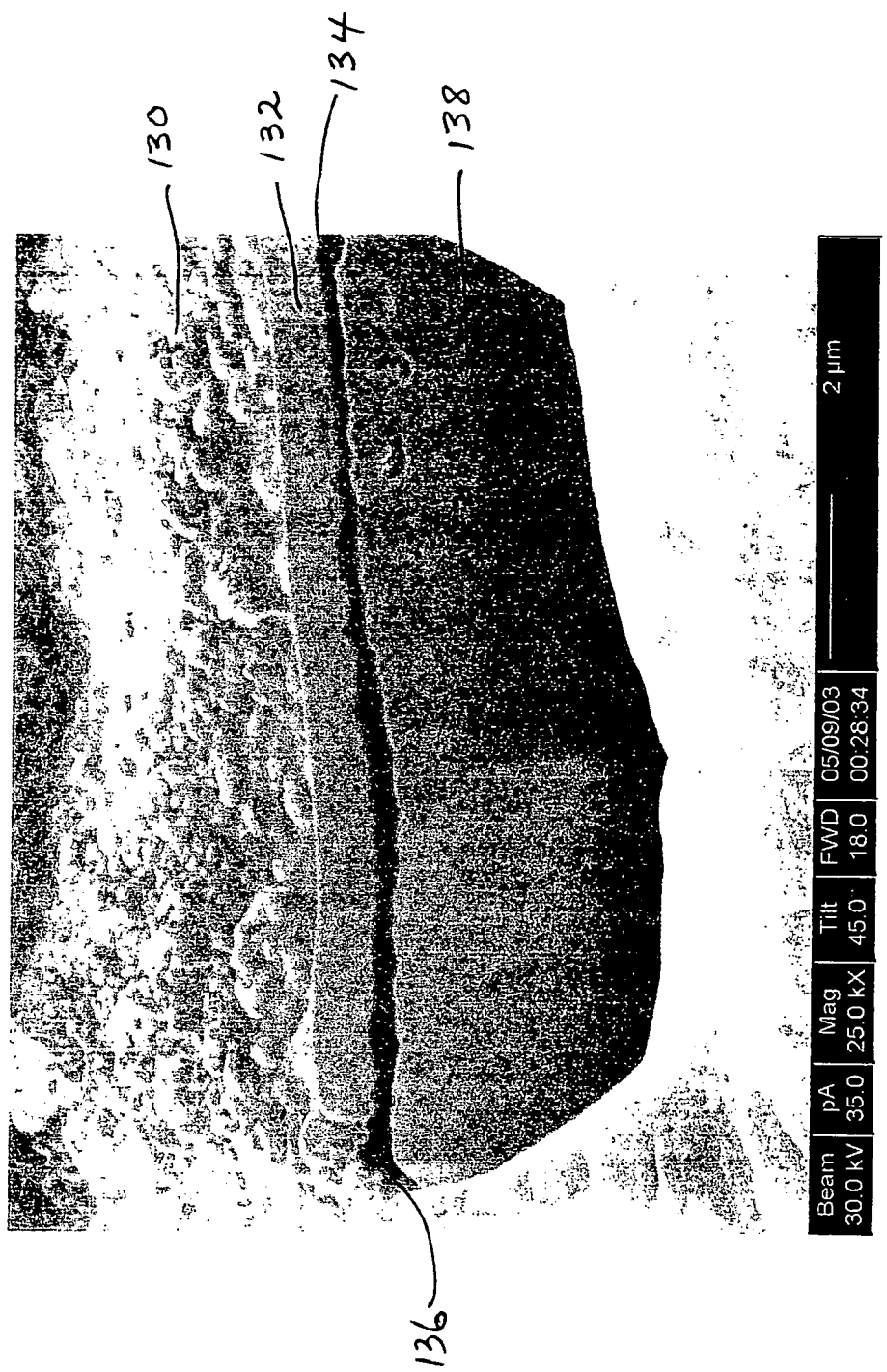
FIG. 13A is a Focused Ion Beam cross section (2 µm scale) of 25 micrometer (µm) FeCrAlY fibers, coated with $TiO_2$, after oxidation for approximately 200 hours at a temperature of approximately 915° C.

A thin layer of sol gel titania ($TiO_2$) is applied on 25 μm FeCrAlY fibers. The comparative mass gain per unit area versus time plots for oxidation of 25 μm FeCrAlY fibers at 915° C. for up to 50 hours, with and without a coating of $TiO_2$ is shown in FIG. 9. The scale morphology was studied by scanning electron micrographs (SEM). FIG. 10A shows an overall view of fibers 100 with a $TiO_2$ coating after firing and FIG. 10B is a zoomed view of the $TiO_2$ coating showing cracks 112, 112a due to "trapped liquid". FIG. 11 is a scanning electron micrograph of 25 μm FeCrAlY fibers 115 coated with $TiO_2$ and oxidized at 915° C. for approximately 200 hours. FIG. 12 is another scanning electron micrograph of 25 μm FeCrAlY fibers 120 coated with $TiO_2$ after oxidation for approximately 200 hours at 850° C. Scale cross section and thickness were examined using focused ion beam (FIB) at two different magnifications: FIG. 13A—25.0 kX and FIG. 13B—50.0 kX. In FIGS. 13A and 13 B, a cross section of a $TiO_2$ coated whisker shows a stacked arrangement of distinct layers, including a top layer of $TiO_2$ 130, a metallic layer of platinum 132 over a second layer of $TiO_2$ 134 that surrounds the platinum metallic fiber, an alumina layer 136 just above the metallic alloy substrate 138. No whiskers were found on the surface of the fibers. A totally oxygen inward oxidation mechanism was achieved. Thus, the lifetime of these fibers is significantly improved. Sol gel titania coating is very effective in depressing the whiskers formation, leading to longer lifetime of FeCrAlY fibers.

Similar results as discussed above are expected with sol gel coatings using small ions such as iron (Fe) and chromium (Cr), which favor the transformation to alpha alumina.

EXAMPLE 2

Coatings with Large Ion Oxides

Figure 14A:
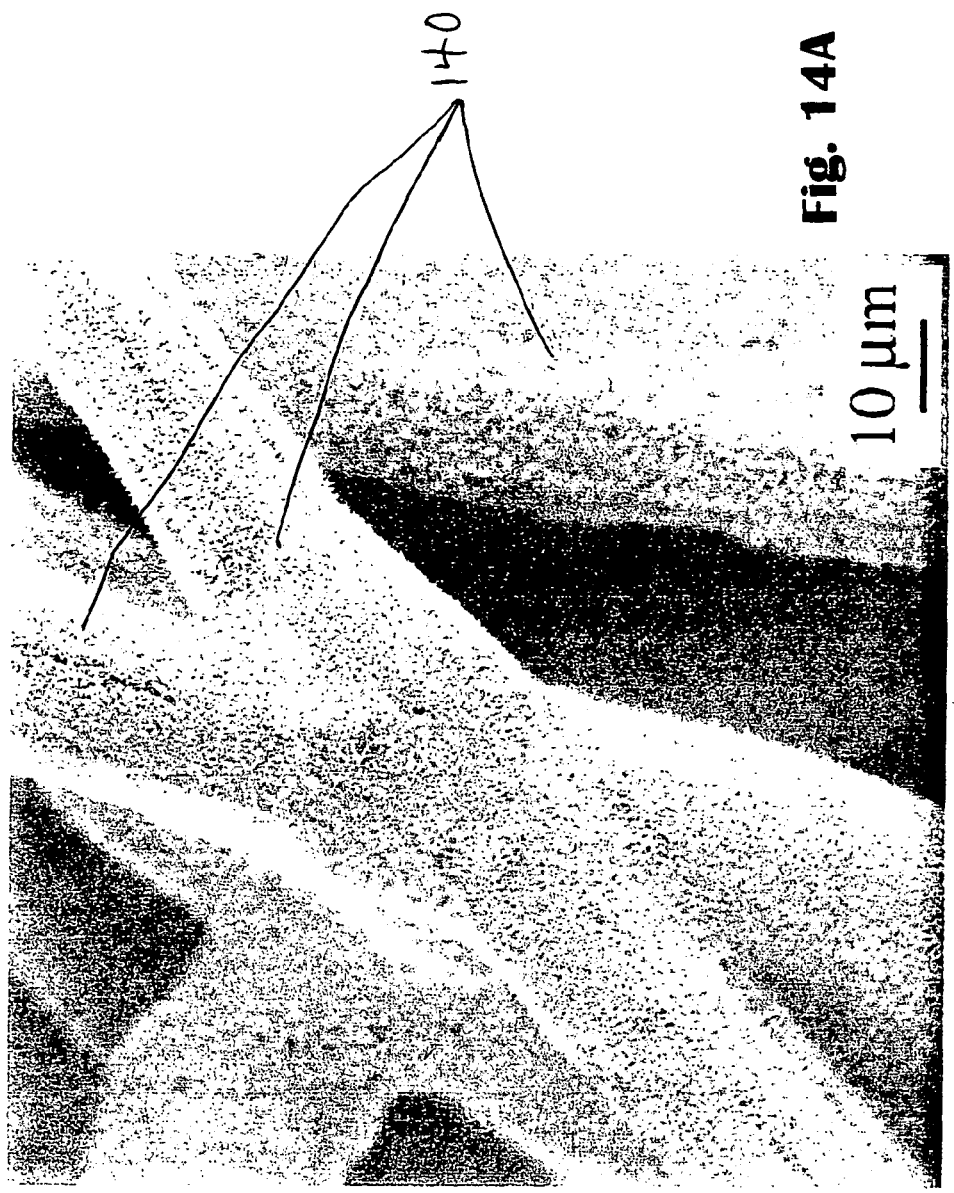
FIG. 14A is a scanning electron micrograph (10 µm scale) of 25 micrometer (µm) FeCrAlY fibers after zirconia coating then heated for approximately 50 hours at a temperature of approximately 850° C.
Figure 14B:
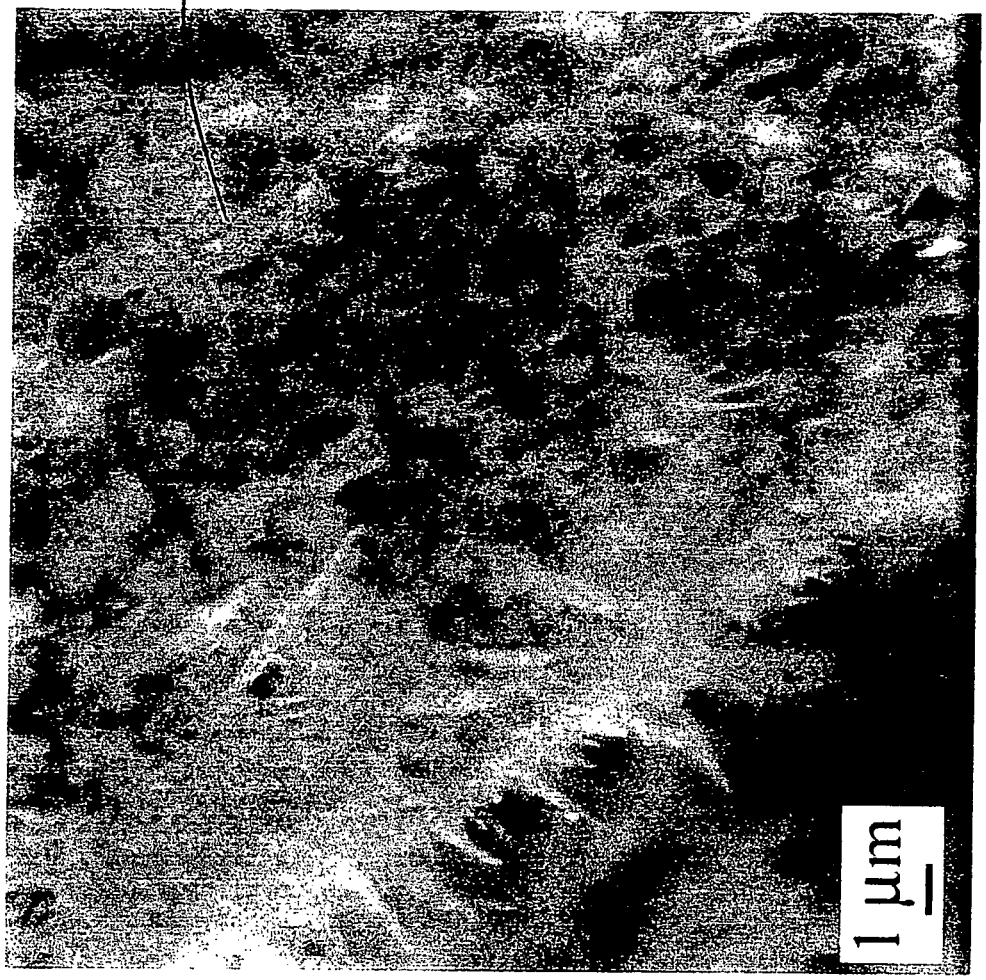
FIG. 14B is a scanning electron micrograph (1 µm scale) of 25 micrometer (µm) FeCrAlY fibers after zirconia coating then heated for approximately 50 hours at a temperature of approximately 850° C.

A thin layer of sol gel zirconium oxide (commonly referred to as, zirconia) ($ZrO_2$) is applied on 25 μm FeCrAlY fibers. Then, the coated fiber is heated in air at temperatures from approximately 850° C. to approximately 950° C. for approximately 50 hours to form whiskers. FIGS. 14A and 14B show two SEM micrographs of the finely-whiskered FeCrAl fibers; in FIG. 14A the whiskered fibers 140 are shown at a magnification of 2000×, and in FIG. 14B the whiskered fibers 145 are shown at a magnification of 10000×.

The formation of alumina whiskers occurred and the transformation of gamma or theta alumina to alpha alumina is delayed by the zirconia coating. Similar results are expected with the use of other large ion oxides such as cerium oxide ($CeO_2$), hafnium oxide ($HfO_2$) and lanthanum ($La_2O_3$). Thus, a large ion oxide coating, such as zirconia, allows the formation of alumina whiskers and then transforms gamma or theta alumina to alpha alumina thereby preserving the structural integrity of the metal alloy fibers.

Figure 15:
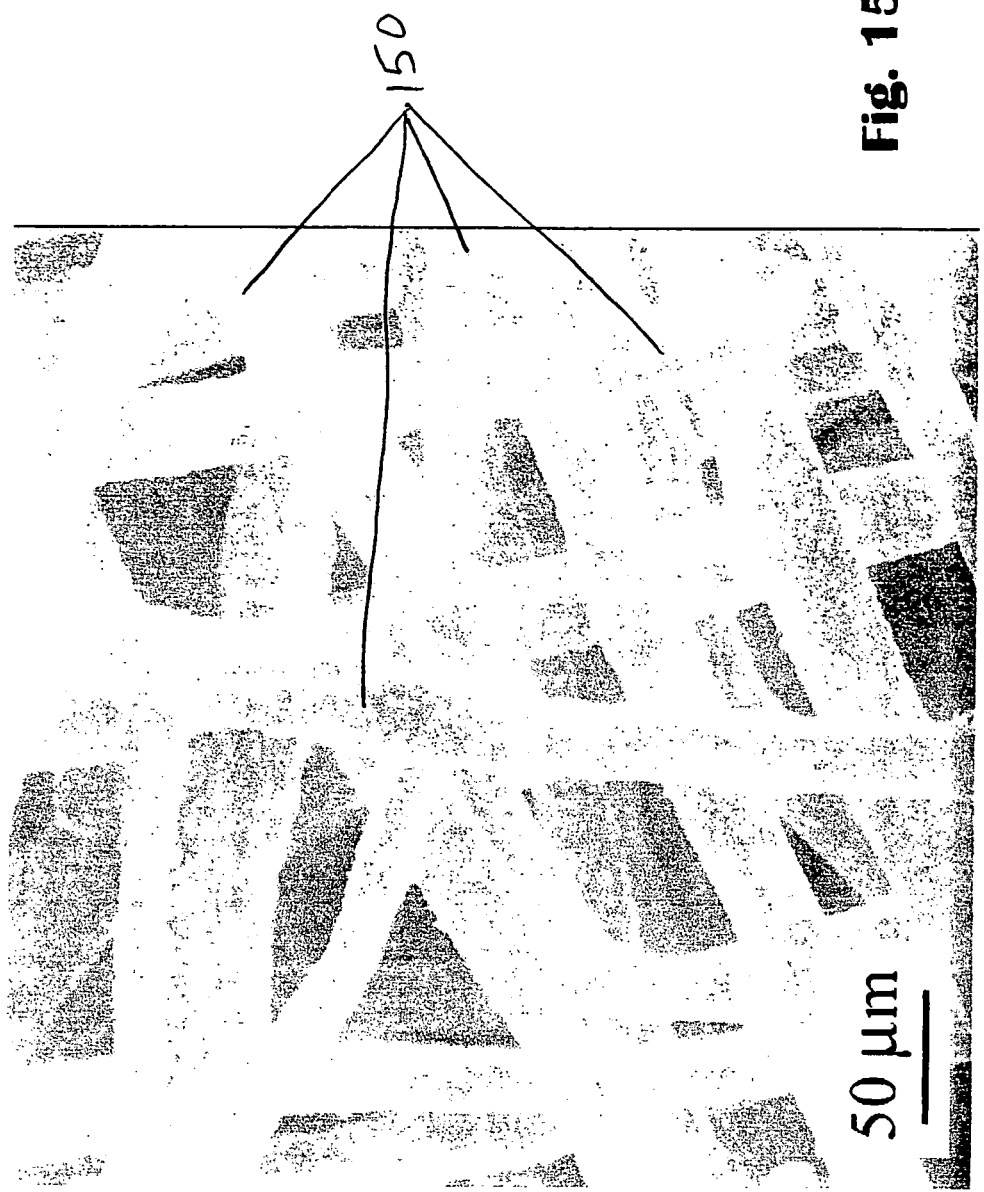
FIG. 15 is a scanning electron micrograph (50 µm scale) of 25 micrometer (µm) finely whiskered FeCrAlY fibers after catalyst coating.
Figure 16A:
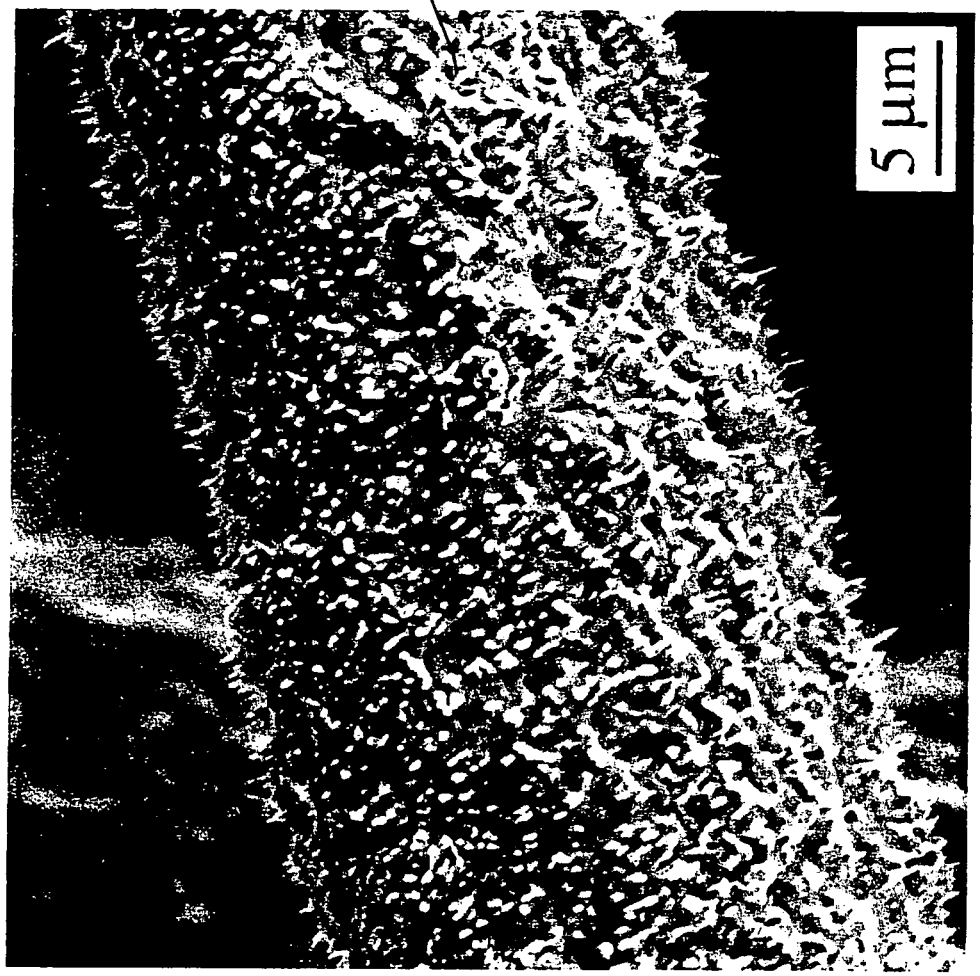
FIG. 16A is a scanning electron micrograph (5 µm scale) of 25 micrometer (µm) finely whiskered FeCrAlY fibers after catalyst coating.

After the formation of whiskers on the fiber surface, a catalyst layer of palladium/alumina is deposited on the whiskered surface using dip coating with alumina sol mixed with palladium (Pd). The thickness of the catalytic coating is adjusted by using different concentrations or multiple dipping. Other catalysts such as platinum or rhodium and a multicomponent sol with alumina, zirconia, ceria may be used to coat the whiskered surface, as one skilled in the art can select from a repertoire of catalytic materials that can be coated onto the whiskered surface. FIG. 15 shows an SEM micrograph of finely-whiskered FeCrAl fiber 150 after catalyst deposition. Detailed features of finely whiskered fibers are shown at two different magnifications. In FIG. 16A the whiskers 160 are shown at a magnification of 2500× and in FIG. 16B, the whiskers 165 are shown at a magnification of 10000×.

The process described above creates a filtration media with a very high surface area. The fine whiskers greatly increase the total surface area of a metallic fiber or substrate and improve filtration efficiency, especially for small particle removal. In addition, the whiskered fiber medium is a good host for catalysts. The adherence of catalysts to substrate is greatly strengthened by the whiskers, which act as pegs. The whiskers function as pegs to fasten other materials, such as implants to a metallic substrate. Thus, there are extended uses for FeCrAl whiskered fibers coated with a catalyst or other substances, including, but not limited to, hot gas cleaning, exhaust cleaning in various industries and in automobiles.

The advantages of the invention are a versatile, efficient whiskered, metallic alloy fiber or substrate, with greatly increased structural integrity, greatly increased surface area. The novel fiber can be used as an advanced filtration device to remove submicron particles or a good host for a catalyst. The catalyst can be used for hot gas cleaning and exhaust gas cleaning in various industries and in automobiles. Commercial uses of the present invention are extensive, including, but not limited to, cleaning of exhaust gas such as, nitrous oxides (NOx and sulfur removal in power plants and chemical industries, automobile catalyst converters and particulate filters, polymer filtration, catalyst recovery burners, industrial gas filtration, liquid filtration, medical and pharmaceutical applications, nuclear venting, hydraulic and fuel filtration and aerospace technology.

While the invention has been described, disclosed, illustrated and shown in various terms of certain embodiments or modification which it has presented in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A method for forming whiskers on the surface of an aluminum-containing metallic alloy substrate comprising the steps of:
    selecting an aluminum-containing metallic alloy fiber is selected from the group consisting of MCrAlX, where M is at least one of iron (Fe), and cobalt (Co) in a range of approximately 60% to approximately 70%, Cr is chromium in a range of approximately 20% to approximately 30%, Al is aluminum in a range of approximately 5% to approximately 10% and X is at least one of yttrium (Y), zirconium (Zr), hafnium (Hf) and ytterbium (Yb) in a range of approximately 0.05% to approximately 0.15%;
    applying a hafnium oxide layer to coat the metallic alloy fiber;
    heating the hafnium oxide coated metallic alloy substrate at oxidation temperatures and for a period of time to form alumina whiskers on the surface of the hafnium oxide coated metallic substrate; and
    depositing a catalyst layer on the whiskered surface using dip coating with at least one catalysts selected from platinum, rhodium and a multicomponent sol with one of alumina, zirconia, and ceria increasing the total surface area of the metallic alloy substrate during oxidation.

2. The method of claim 1, wherein the aluminum-containing metallic alloy substrate is FeCrAlX.

3. The method of claim 1, wherein the aluminum-containing metallic alloy substrate is FeCrAlY.

4. The method of claim 1, wherein the metallic alloy substrate is a fiber.

5. The method of claim 1, wherein the heating of the metallic alloy substrate occurs at temperatures from approximately 800° C. to approximately 1000° C.

6. The method of claim 1, wherein the time period for heating is between approximately 50 hours to approximately 100 hours.

7. The method of claim 1, wherein the aluminum-containing metallic alloy substrate is CoCrAlX.

8. A method for forming whiskers on the surface of an aluminum-containing metallic alloy substrate by oxidizing the surface, comprising the steps of:
    providing an aluminum-containing metallic alloy substrate is selected from the group consisting of MCrAlX, where M is one of cobalt (Co) and nickel (Ni) in a range of approximately 60% to approximately 70%, Cr is chromium in a range of approximately 20% to approximately 30%, Al is aluminum in a range of approximately 5% to approximately 10% and X is at least one of yttrium (Y), zirconium (Zr), hafnium (Hf) and ytterbium (Yb) in a range of approximately 0.05% to approximately 0.15%;
    applying a hafnium oxide layer to coat the metallic alloy substrate;
    oxidizing the hafnium oxide coated metallic alloy substrate at selected temperatures and for a period of time to form alumina whiskers on the surface of the hafnium oxide coated metallic substrate; and
    depositing a catalyst layer of oxide on the whiskered surface thus increasing the total surface area of the metallic alloy substrate during oxidation.

9. The method of claim 8, wherein the aluminum-containing metallic alloy substrate is selected from the group consisting of MCrAlX, where M is cobalt (Co), Cr is chromium, Al is aluminum and X is at least one of yttrium (Y), zirconium (Zr), hafnium (Hf) and ytterbium (Yb).

10. The method of claim 9, wherein the aluminum-containing metallic alloy substrate is CoCrAlY.

11. The method of claim 9, wherein the aluminum-containing metallic alloy substrate is CoCrAlYb.

12. The method of claim 8, wherein the metallic alloy substrate is a fiber.

13. The method of claim 8, wherein the oxidizing of the metallic alloy substrate occurs at temperatures from approximately 800° C. to approximately 1000° C.

14. The method of claim 8, wherein the time period for heating is between approximately 10 hours to approximately 100 hours.

15. The method of claim 8, wherein the aluminum-containing metallic alloy substrate is selected from the group consisting of MCrAlX, where M is nickel (Ni)), Cr is chromium, Al is aluminum and X is at least one of, zirconium (Zr), hafnium (Hf) and ytterbium (Yb).

\* \* \* \* \*